United States Patent [19]
Eida et al.

[11] Patent Number: 5,869,929
[45] Date of Patent: Feb. 9, 1999

[54] MULTICOLOR LUMINESCENT DEVICE

[75] Inventors: Mitsuru Eida; Chishio Hosokawa; Masahide Matsuura, all of Sodegaura, Japan

[73] Assignee: Idemitsu Kosan Co., Ltd., Tokyo, Japan

[21] Appl. No.: 857,001

[22] Filed: May 15, 1997

[30] Foreign Application Priority Data

Feb. 4, 1997 [JP] Japan .................................. 9-034240

[51] Int. Cl.$^6$ ........................................................ H01J 1/62
[52] U.S. Cl. ............................ 313/501; 313/461; 313/473
[58] Field of Search .................................. 313/501, 502, 313/506, 512, 461, 463, 466, 473, 474

[56] References Cited

U.S. PATENT DOCUMENTS 5,661,371  8/1997  Salerno et al. ............................ 313/502

Primary Examiner—Vip Patel
Attorney, Agent, or Firm—Oblon, Spivak, McClelland, Maier & Neustadt, P.C.

[57] ABSTRACT

A multicolor luminescent device comprising a color conversion material in which a plurality of shielding layers and a plurality of different color conversion layers are separately and repeatedly assembled on the same flat, alternating with each other, and an organic EL emitting material including a plurality of organic EL elements separately assembled on the same flat at each position corresponding to the plurality of color conversion layers, the color conversion material and the organic EL emitting material being disposed so as to sandwich a transmittable medium between them, characterized in that the distance ($d_1$) between the color conversion material and the organic EL emitting material and the width ($d_2$) of the shielding layer satisfy the equation, $d_2 \geq d_1$. This multicolor luminescent device has excellent characteristics in the angle of view, is capable of inhibiting the occurrence of color drift, and has excellent visibility and practical use

10 Claims, 13 Drawing Sheets

MULTICOLOR LUMINESCENT DEVICE

DESCRIPTION OF THE BACKGROUND ART

This invention relates to a multicolor luminescent device, especially to a multicolor luminescent device suitable for use in public and industrial indicators, color displays, and the like.

Electronic display devices which are generally called man machine interfaces transfer a variety of information from various machines to man via the organ of vision. The electronic display devices play an important role as interfaces linking man with machines.

There are an active type (light emitting type) and a passive type (light accepting type) for such electronic display devices. The active type includes, for example, a CRT (Cathode Ray Tube), PDP (Plasma Display Panel), ELD (Electro Luminance Display), VFD (Vacuum Fluorescent Display), and LED (Light Emitting Diode). On the other hand, the passive type includes, for example, an LCD (Liquid Crystal Display), ECD (Electro Chemical display), EPID (Electro Phoretic Image Display), SPD (Suspended Particle Display), TBD (Twisting Ball Display), and PLZT (Transparent Ceramics Display, transparent ferroelectric PLZT ((Pb, La) (Zr, Ti)$O_3$ ceramic display).

Among these displays, the ELD is characterized in exhibiting high visibility due to self-emission and in having excellent impact resistance because of being completely a solid. At present, the development of variable ELDs using an inorganic or an organic compound as the emitting layer is being advanced. Especially, an organic ELD (or organic EL element) in which an organic compound is sandwiched between two electrodes is notable because it can use many sorts of organic compounds and efficiently emit a highly intensive light with a variety of colors.

The methods for preparing a full-color organic ELD include, for example, a method for separately positioning emitting parts of the organic EL elements on the same flat and emitting light with different colors, e.g. three primary colors, that is, red, blue, and green; and a method for separating or converting a monocromatic light using color conversion layers, e.g. a color filter or a fluorescent material.

However, it is necessary to exploit luminous materials of different colors for emitting lights of different colors, thereby providing multiple colors. There is also the problem of inferior durability in a process, for example, photolithography, for separately positioning the emitting parts of the organic EL elements on the same flat. In contrast, the latter method for separating or converting the monocromatic light using the color conversion layers is excellent and simple since it is only provided with a layer emitting a monocromatic color as the emitting layer.

However, because the color conversion layers are provided in addition to the organic EL elements in the latter method, gaps are made between the organic EL elements and the color conversion layers and also between the color conversion layers. These gaps cause light leakage from the organic EL elements and the color conversion layers so that the angle of view is narrowed (the phenomenon of color drift). Therefore, by this method, only a multicolor luminescent device with degraded visibility can be provided.

For this, disclosed is a method in which a transparent resin layer is provided between EL elements and color filters and the thickness of the transparent resin layer is less than the interval between pixels of the EL elements as shown in FIG. 15 (see Japanese Patent Application Laid-open No. 94878/1993).

However, there is no shielding layer in this structure. Light leakage from the side surface of the color filter layers is not prevented so that the problem of angle of view is insufficiently solved. Also, even if, for example, a fluorescent material is used instead of the color filter layers, it emits a fluorescent light more isotropically. As a result, light leakage is increased, thereby impairing the visibility.

Further, a multicolor luminescent device in which fluorescent media are arranged to accept the emitting light from the organic EL elements is disclosed (see Japanese Patent Application Laid-open No. 258860/1993). However, no light-shielding layer positioned between the fluorescent media is disclosed, as shown in FIG. 16. Therefore, the problem of angle of view is insufficiently solved by this method.

In addition, an EL panel is disclosed wherein spacers having a light-shielding capability and projecting almost vertically to the substrate surface of EL elements are disposed in the clearances between pixels of the EL elements while color filters face EL elements as shown in FIG. 17 (see Japanese Patent Application Laid-open NO. 94879/1993).

In this case, the problem of angle of view is solved, but the relation between the thickness of the light shielding layer and the thickness of the color conversion layer is not clearly disclosed. Also, the relation between the distance between the organic EL element and the shielding layer and the width of the shielding layer is not clearly disclosed. Therefore, a substantially full-color ELD cannot be manufactured.

Also, as shown in FIG. 18, a color display in which EL elements and color filters are facing each other is disclosed (see Japanese Patent Application Laid-open No. 40888/1988). However, there is no clear disclosure of the relation between the thickness of the light shielding layer and the thickness of the color conversion layer, and also there is no clear disclosure of the relation between the distance from the organic EL elements to the shielding layer and the width of the shielding layer in the same way as the above method. Therefore, a substantially full-color ELD cannot be manufactured.

This invention has been achieved in view of this situation and has an object of providing a multicolor luminescent device which has excellent characteristics in the angle of view, is capable of inhibiting the occurrence of color drift (color mixing), and has excellent visibility and practical use.

SUMMARY OF THE INVENTION

The above object can be attained in the present invention by the provision of a multicolor luminescent device comprising a color conversion material in which a plurality of shielding layers and a plurality of different color conversion layers are separately and repeatedly assembled on the same flat, alternating with each other, and an organic EL emitting material including a plurality of organic EL elements separately assembled on the same flat at each position corresponding to the plurality of color conversion layers, the color conversion material and the organic EL emitting material being disposed, sandwiching a transmittable medium between them, characterized in that the distance ($d_1$) between the color conversion material and the organic EL emitting material and the width ($d_2$) of the shielding layer satisfy the equation, $d_2 \geq d_1$.

In preferred embodiments of the present invention, the film thickness ($T_1$) of the shielding layer and the film thickness ($T_2$) of the color conversion layer satisfy the equation, $T_1 \geq T_2$; the emitting area ($S_1$) of the organic EL element and the area ($S_2$) occupied by the color conversion layer satisfy the equation $S_2 \geq S_1$;

the color conversion layer includes fluorescent layers;

the thickness of the shielding layer is 10 µm or more;

the refractive index ($n_1$) of the color conversion layer and the refractive index ($n_2$) of the transmittable medium contacting the color conversion layer satisfy the equation, $|n1-n2|<0.4$;

the width ($d_2$) of the shielding layer decreases gradually or stepwise from side of the transmittable medium to the opposite side;

the transmission factor of the shielding layer at a wave length of 400 nm–700 nm is 10% or less; and the reflection factor of the shielding layer at least in the side contacting the color conversion layer at a wave length of 400 nm–700 nm is 10% or more.

As illustrated above, the present invention can provide a multicolor luminescent device capable of inhibiting the occurrence of color drift (color mixing), exhibiting excellent visibility and having a practical use.

BRIEF DESCRIPTIONS OF THE DRAWINGS

FIG. 1 is a schematic view of an embodiment of the multicolor luminescent device of the present invention, in which

FIG. 2 is a schematic and sectional view of a support substrate used in the present invention, in which

FIG. 3 is an explanatory drawing schematically showing the relation between the distance ($d_1$) between the organic EL emitting material and the color conversion material and the width ($d_2$) of the shielding layer, in which

Figure 5A:
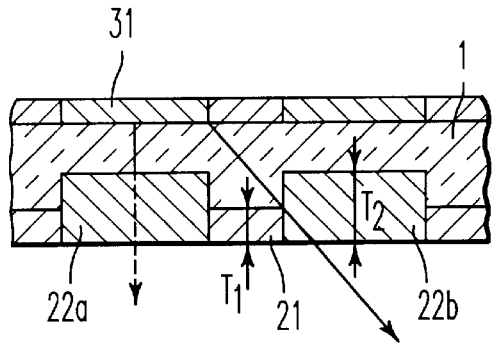
Figure 5D:
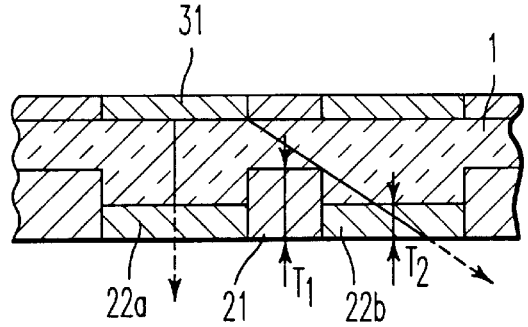
Figure 5B:
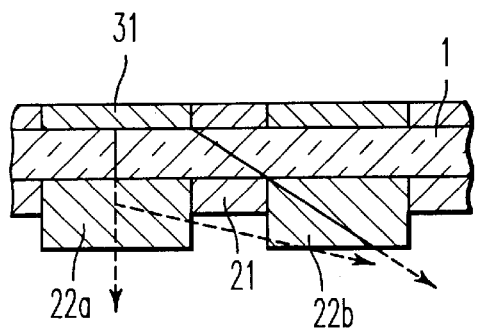
Figure 5E:
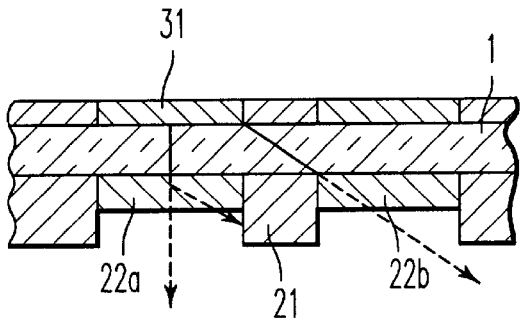
Figure 5C:
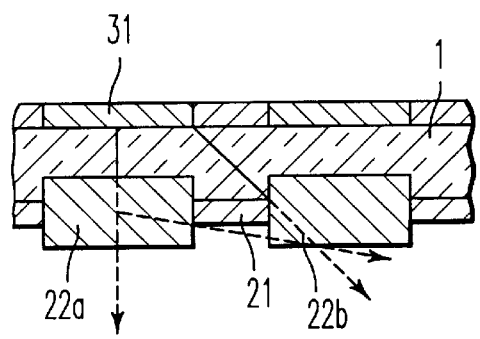
Figure 5F:
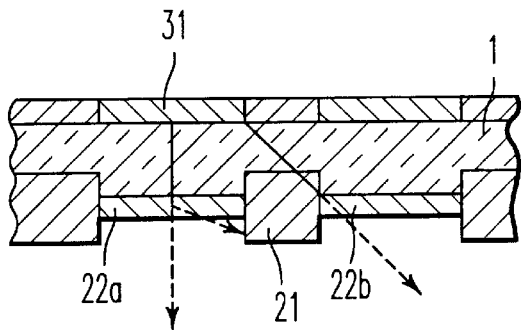

FIG. 5 a sectional and explanatory diagram for schematically explaining the relation between the film thickness ($T_1$) of the shielding layer and the film thickness ($T_2$) of the color conversion layer, in which FIGS. 5(a)–5(c) show cases where the equation, $T_1<T_2$, is satisfied and FIGS. 5(d)–5(f) show cases where the equation, $T_1>T_2$, is satisfied.

FIG. 6 is a schematic plain view explaining a case where the equation, $S_2 \geq S_1$, is satisfied.

Figure 7A:
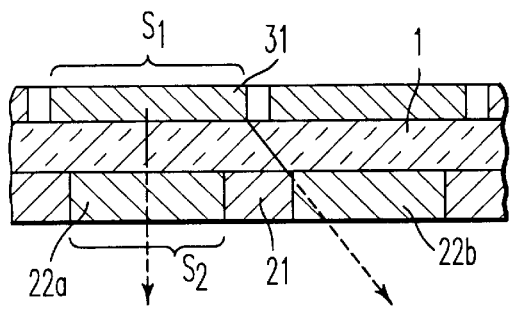
Figure 7B:
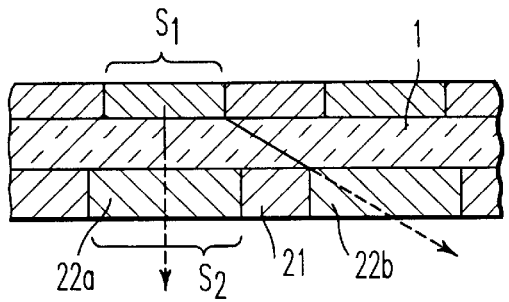

FIG. 7 is a sectional and explanatory diagram for explaining the relation between the emitting area ($S_1$) of the organic EL element and the area ($S_2$) of the color conversion layer, in which FIG. 7(a) shows a case where the equation, $S_1>S_2$, is satisfied and FIG. 7(b) shows a case where the equation, $S_1 \leq S_2$, is satisfied.

Figure 8A:
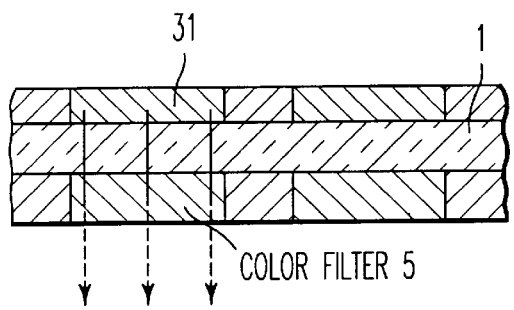
Figure 8B:
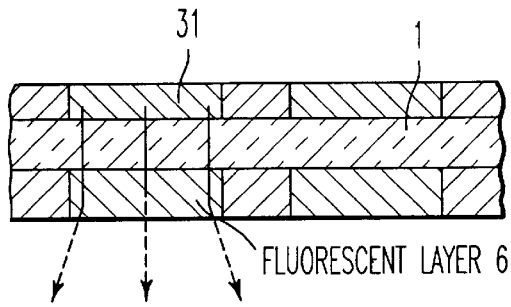

FIG. 8 is a sectional and explanatory diagram schematically showing the color conversion layer used in the present invention, in which FIGS. 8(a) and 8(b) show cases where a color filter and a fluorescent layer are used respectively.

Figure 9A:
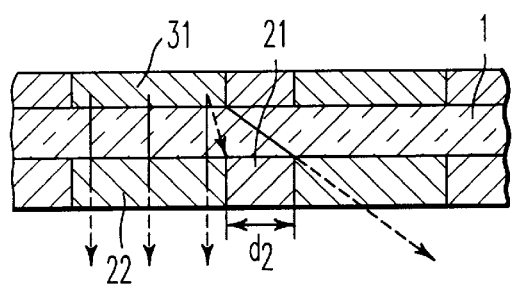
Figure 9B:
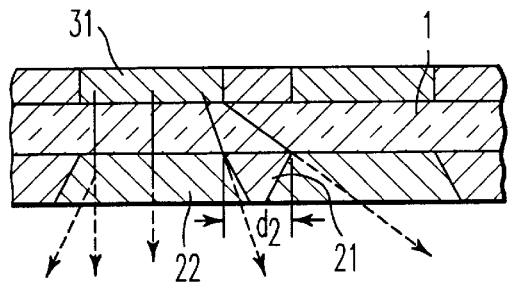
Figure 9C:
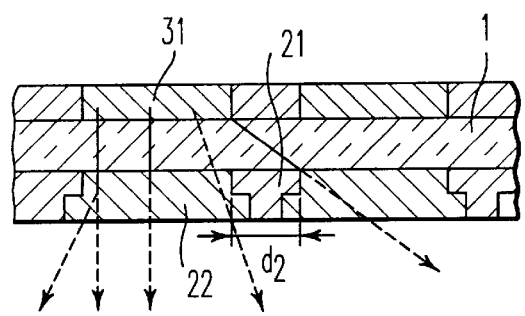

FIG. 9 is a sectional and explanatory diagram schematically showing the configuration of the shielding layer used in the present invention, in which FIGS. 9(a)–9(c) show cases where the configuration is rectangular, inversely trapezoidal, and T-shaped respectively.

Figure 10A:
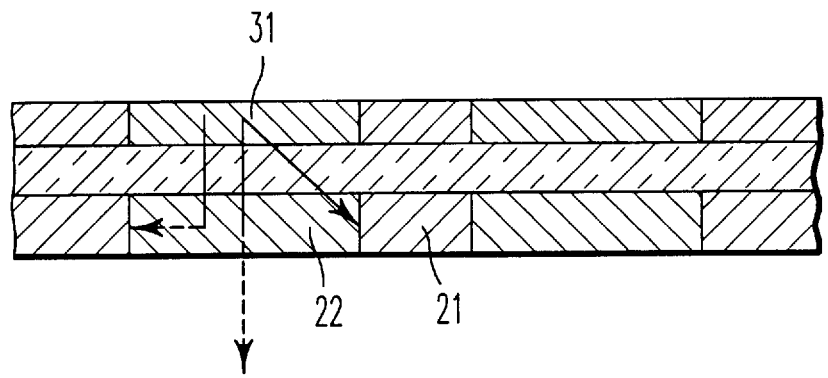
Figure 10B:
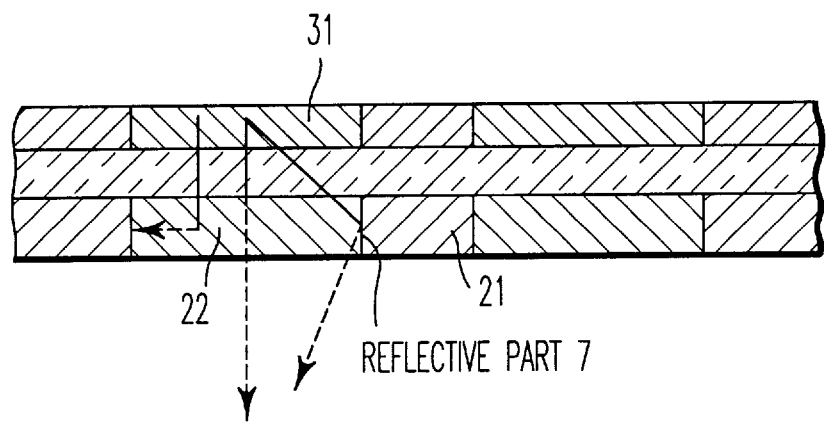
Figure 10C:
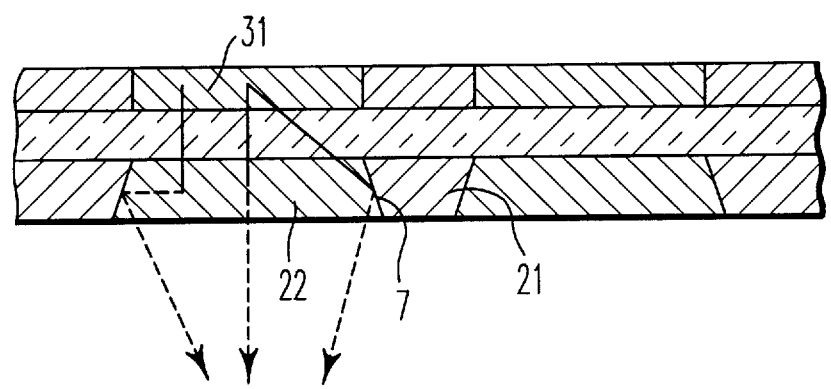

FIG. 10 is a sectional and explanatory diagram schematically showing the reflective part of the shielding layer in the side contacting the color conversion layer, in which FIGS. 10(a)–10(c) show cases where the reflective part is not provided, the reflective part is provided on the shielding layer with a rectangular configuration, and the reflective part is provided on the shielding layer with a inversely trapezoidal configuration.

Figure 11:
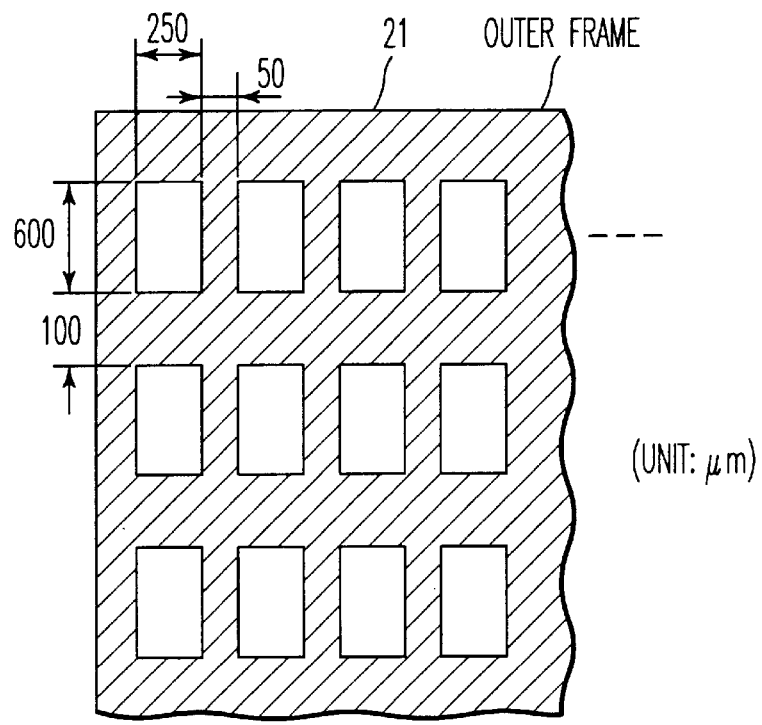

FIG. 11 is an explanatory view schematically showing an example of a pattern of the shielding layer in this invention.

Figure 12:
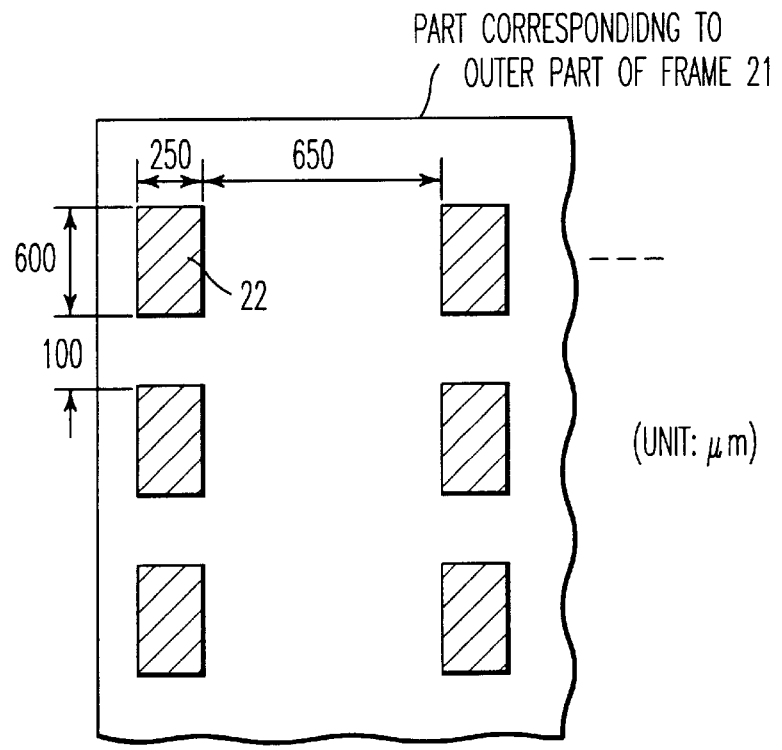

FIG. 12 is an explanatory view schematically showing an example of a dot pattern ($S_2$) of stripe array in this invention.

Figure 13:
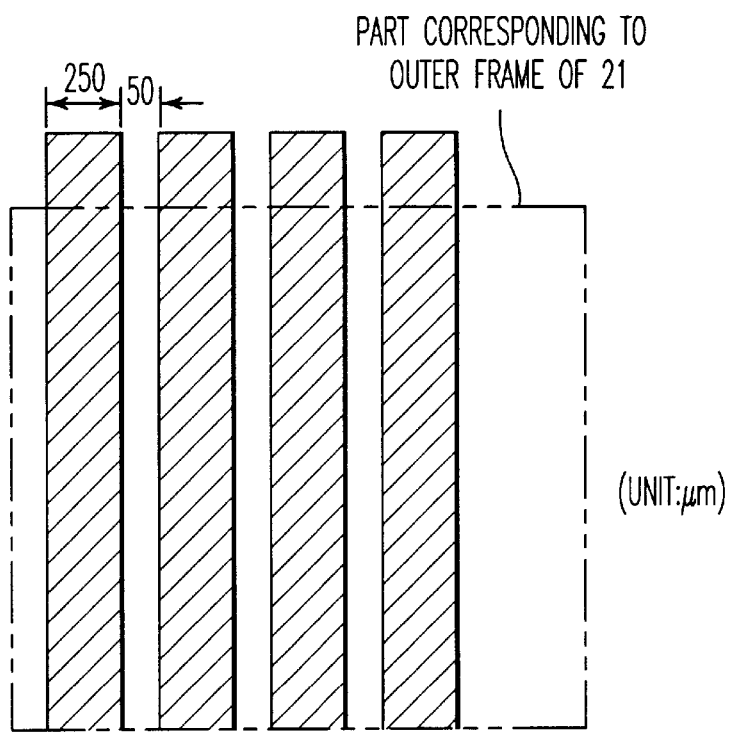

FIG. 13 is an explanatory view schematically showing an example of a stripe pattern of the anode (ITO) in this invention.

Figure 14:
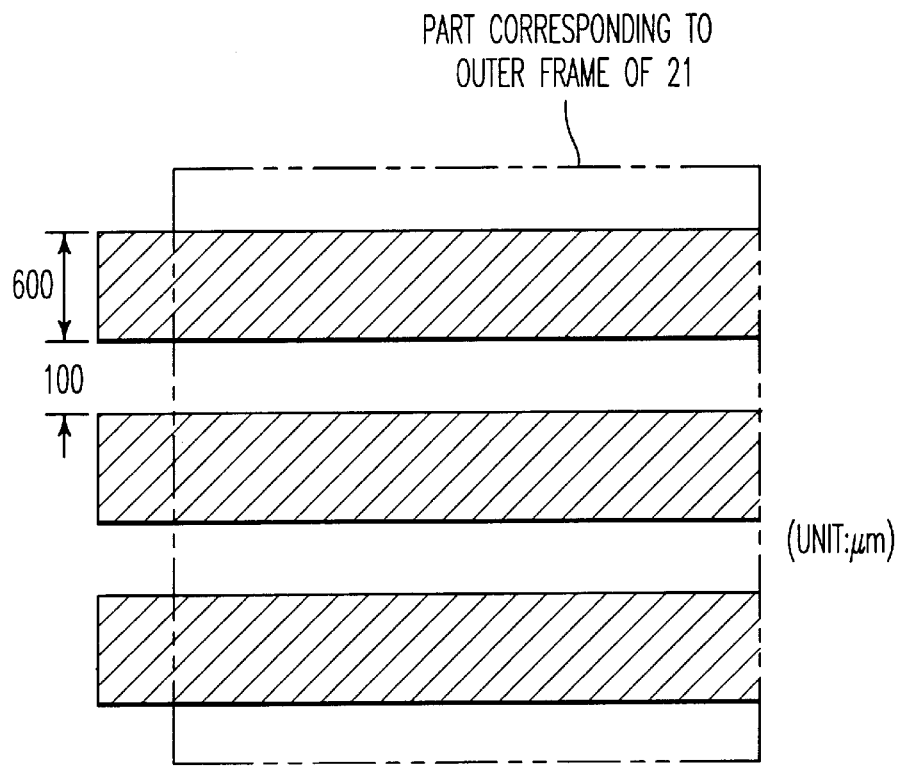

FIG. 14 is an explanatory view schematically showing an example of a stripe pattern of the cathode in this invention.

Figure 15:
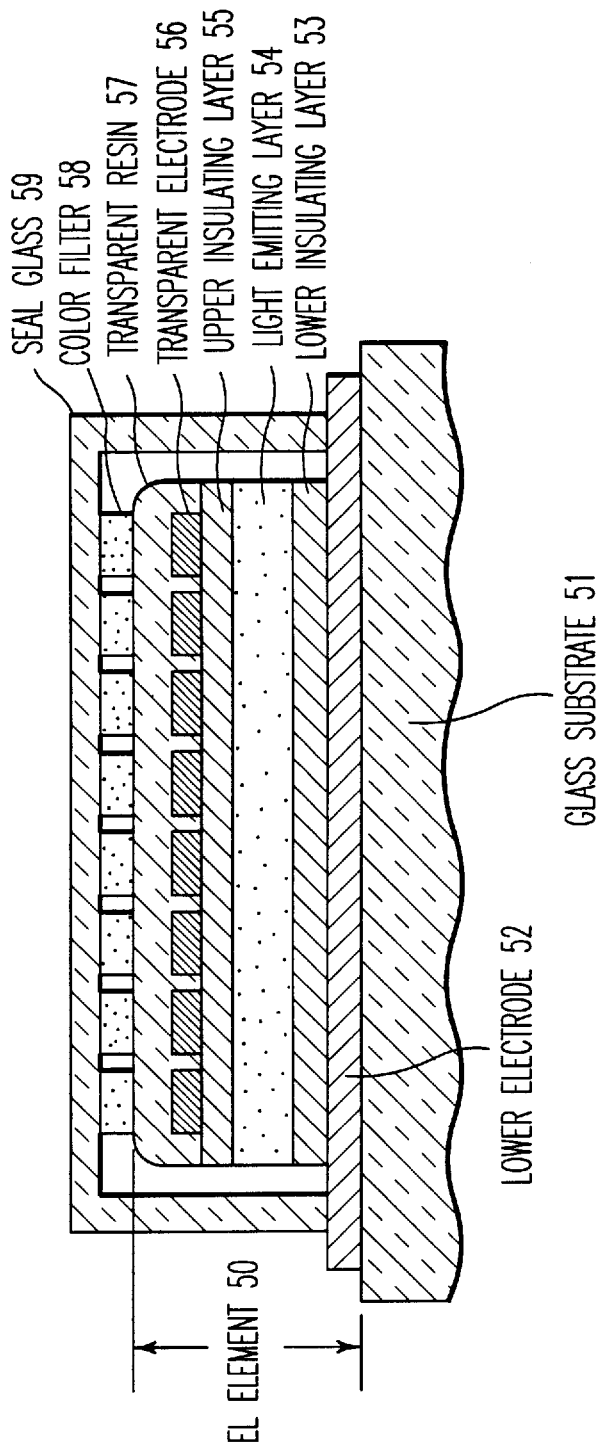

FIG. 15 is a sectional view of prior art showing a case where a transparent resin layer is provided between EL elements and color filters.

Figure 16A:
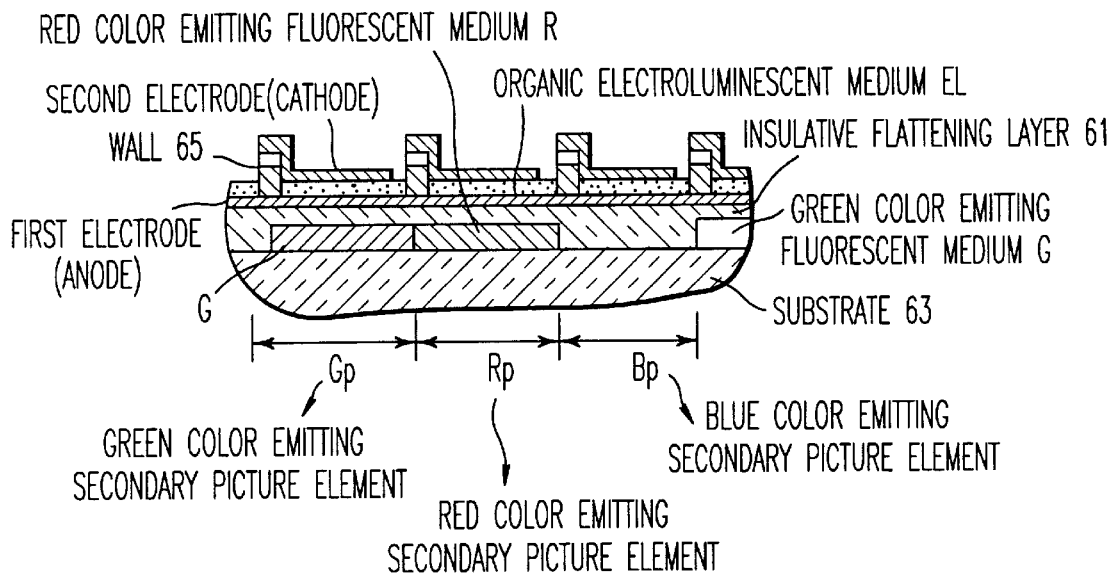
Figure 16B:
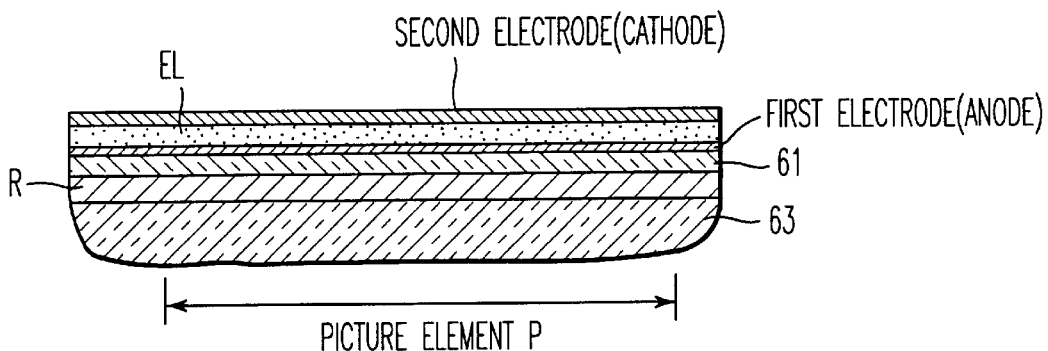
Figure 16C:
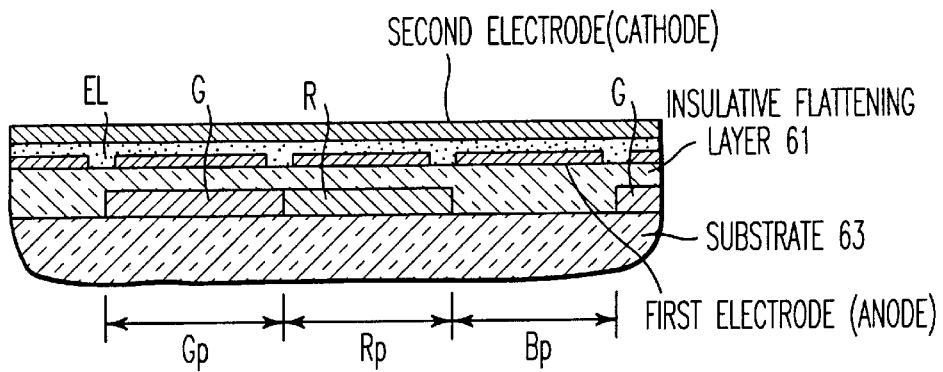

FIG. 16 is a sectional view of prior art showing a case where a fluorescent medium, is disposed to accept emitting light from organic EL elements.

Figure 17:
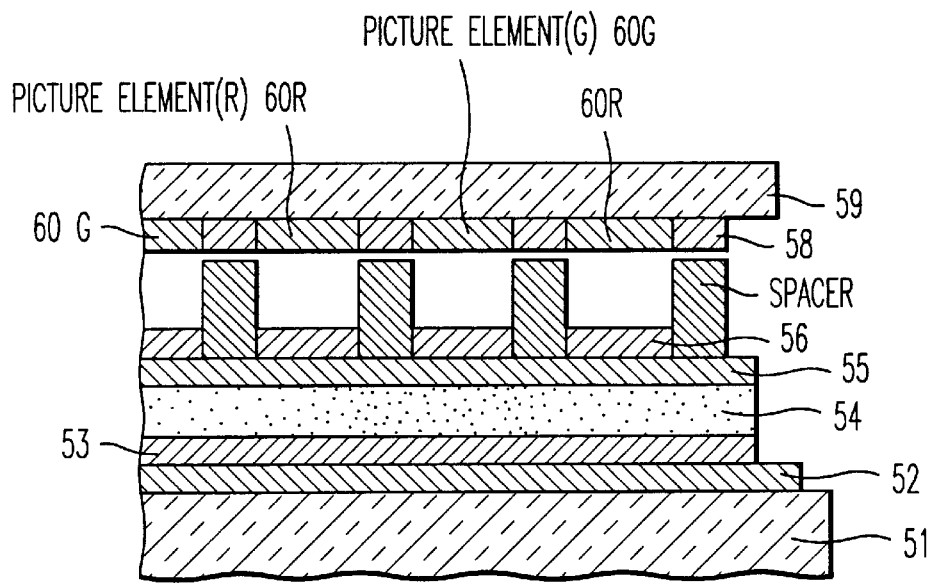

FIG. 17 is a sectional view of prior art showing a case where spacers having a light-shielding capability are disposed in the gaps between pixels of EL elements.

Figure 18A:
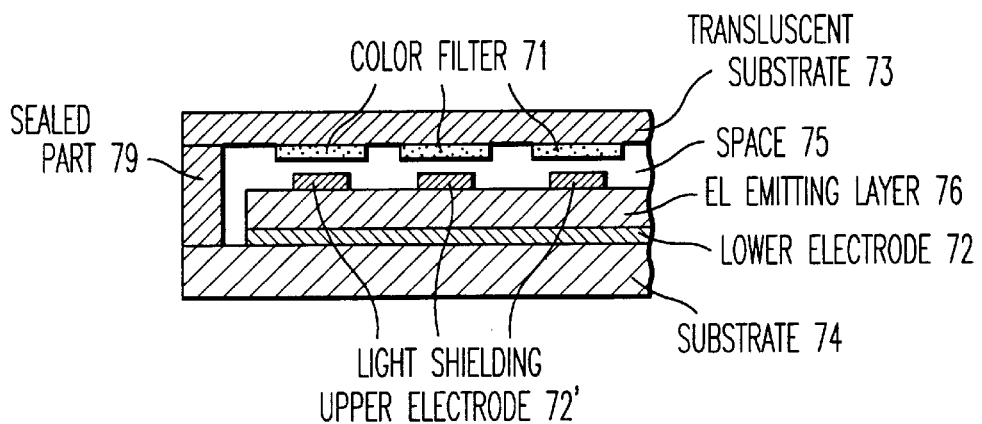
Figure 18B:
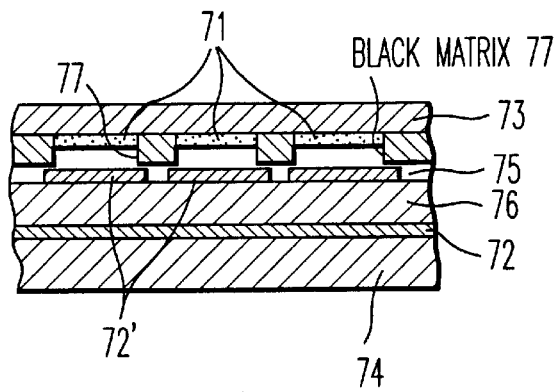

FIG. 18 is a sectional view of prior art showing a case where EL elements and color filters are facing each other.

DETAILED DESCRIPTION OF THE INVENTION AND PREFERRED EMBODIMENTS

The present invention will now be explained in detail by way of an embodiment of the multicolor luminescent device with reference to the drawings.

1. Structure of the multicolor luminescent device

Figure 1A:
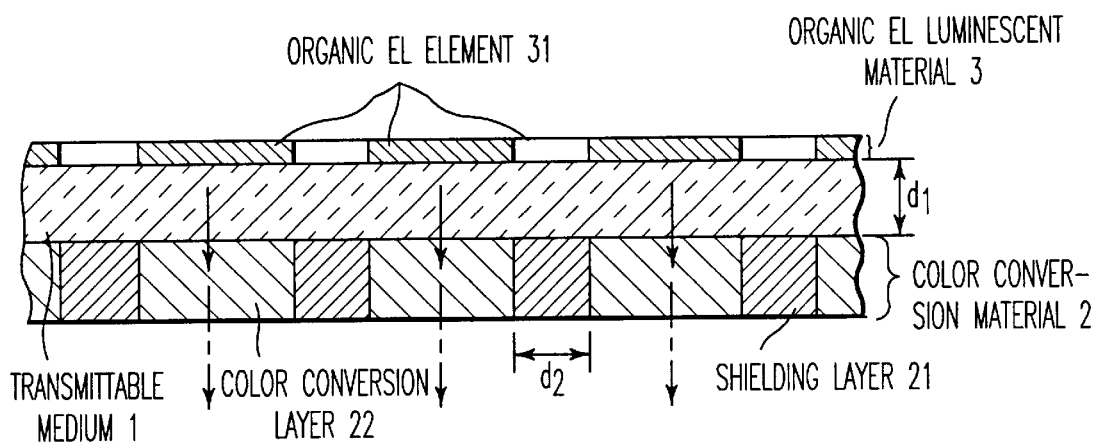
FIG. 1(a) is a sectional view.
Figure 1B:
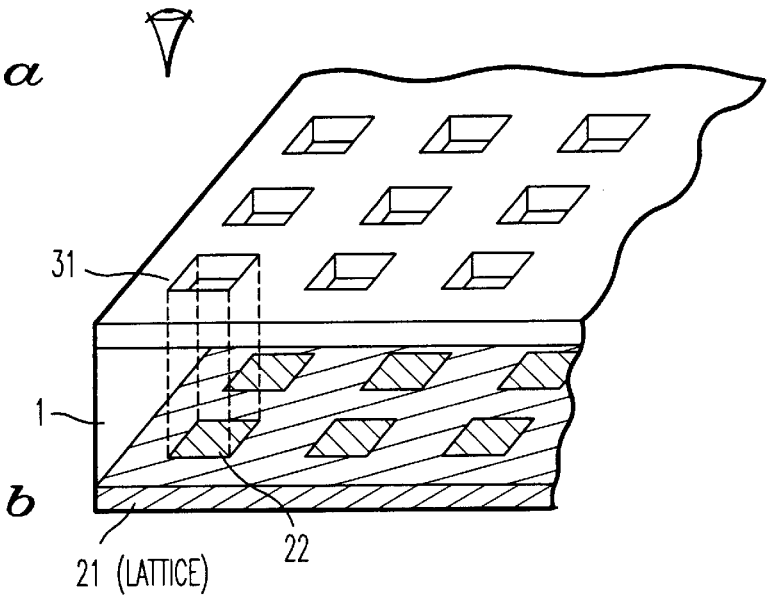
FIGS. 1(b) and 1(c) are perspective illustrations.
Figure 1C:
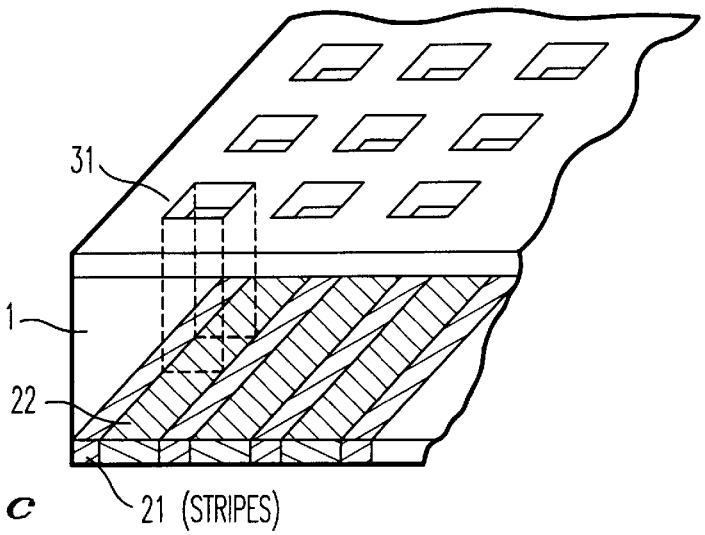

As shown in FIGS. 1(a), 1(b), and 1(c), the multicolor luminescent device comprises at least a color conversion material 2 in which a plurality of shielding layers 21 and a plurality of different color conversion layers 22 are separately and repeatedly assembled on the same flat, alternating with each other, and an organic EL emitting material 3 including a plurality of organic EL elements 31 separately assembled on the same flat at each positions corresponding to the plurality of color conversion layers, the color conversion material and the organic EL emitting material being disposed so as to sandwich a transmittable medium 1 between them.

When each organic EL element 31 emits light, the light passes through the transmittable medium 1. The light from the EL elements 31 is then resolved and converted by a corresponding color conversion layers 22 which emit light different from the light emitted from the EL elements 31. Then, the light emitted from the color conversion layers 22 reaches the eye. Multicolor luminance can be realized by separately disposing the different color conversion layers 22 on the same flat in this manner.

Figure 2A:
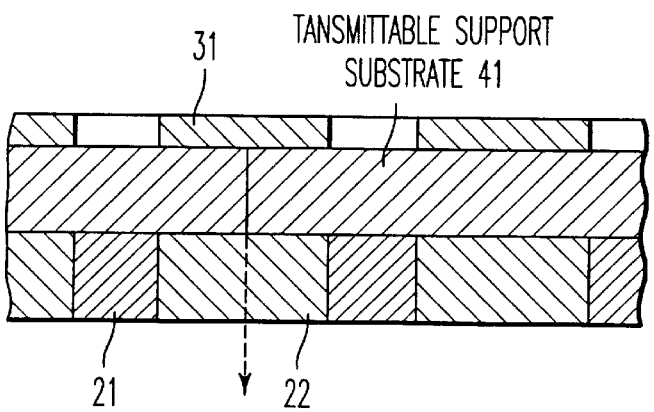
FIG. 2(a) and 2(b) show cases where a transparent type substrate is used and FIG. 2(c) shows a case where the use of the transparent type substrate is not required.
Figure 2B:
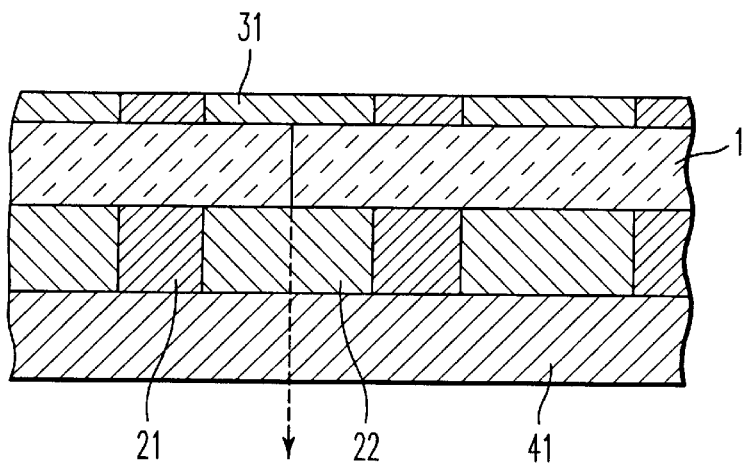
Figure 2C:
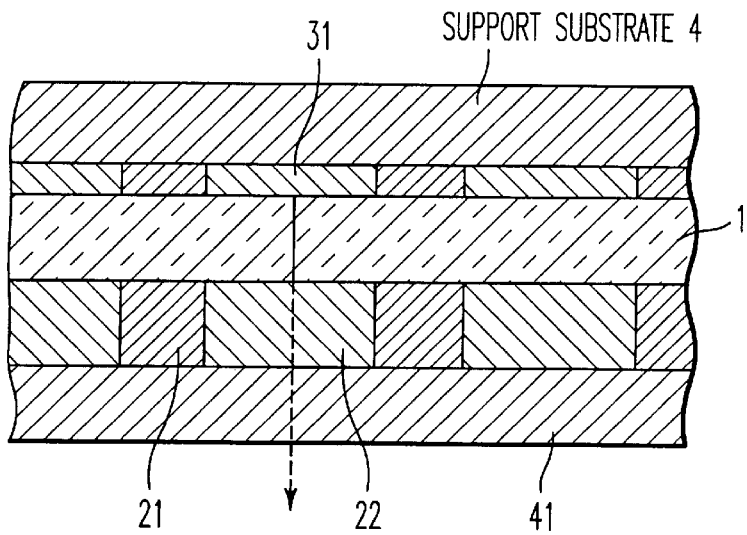

A substrate for supporting the multicolor luminescent device is to be provided to realize of practical use. FIGS. 2(a)–2(c) show embodiments provided with the substrate. FIG. 2(a) shows an embodiment using the transmittable medium 1 as a support substrate 41, FIG. 2(b) shows an embodiment in which the support substrate 41 is located under the color conversion layers 22 and the shielding layer 21, and FIG. 2(c) shows an embodiment in which a support substrate 4 is located on the organic EL elements 31.

Here, it is important to consider the relation of the distance $d_1$ between the color conversion material 2 and the organic EL emitting material 3 to the width $d_2$ of the shielding layer 21. It is necessary to satisfy the equation, $d_2>d_1$.

Here, the $d_1$ is the vertical distance between the position corresponding to the dividing line between the shielding layer 21 of the color conversion material 2 and the transmittable medium 1 and the organic EL elements 31, strictly the position corresponding mainly to an emitting portion such as an emitting layer. Incidentally, because the organic EL element is formed of a thin film with a thickness of less than 1 μm, the latter position may be defined as the dividing line between the organic EL elements 31 and the transmittable medium 1. $d_2$ indicates the width of the shielding layer 21 at the side connected to the transmittable medium 1.

Figure 3B:
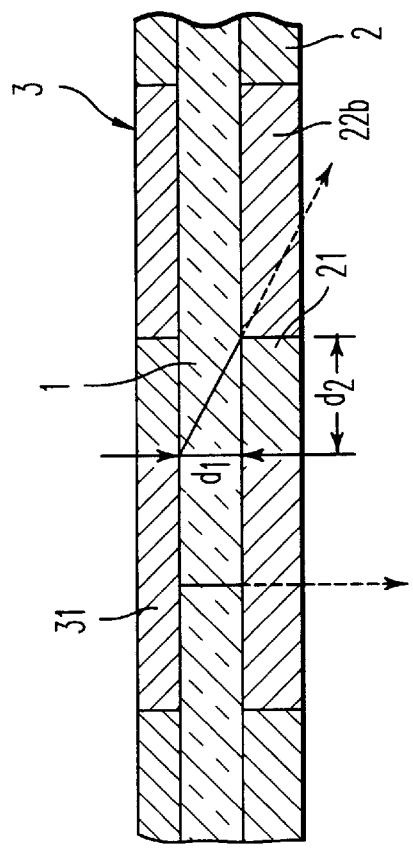
FIG. 3(b) shows a case where the equation, $d_1 \leq d_2$, is satisfied.
Figure 3A:
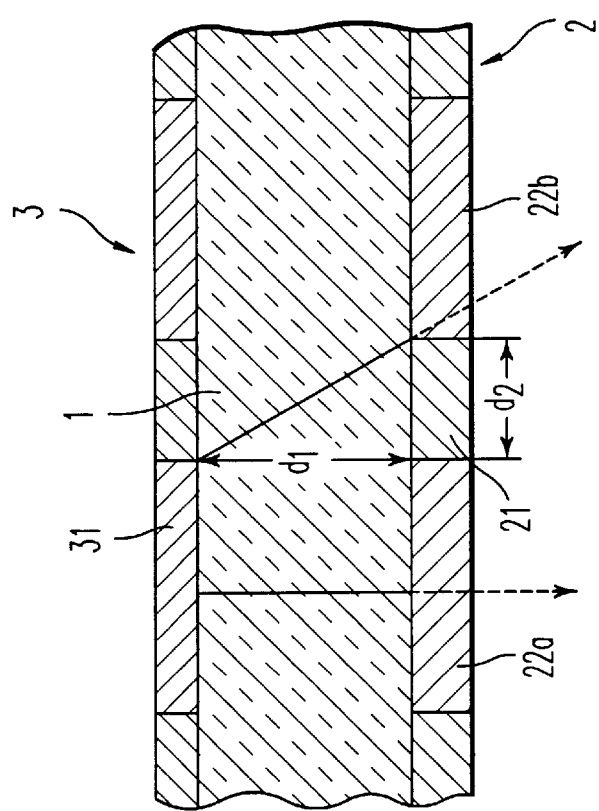
FIG. 3(a) shows a case where the equation, $d_1>d_2$, is satisfied
Figure 4:
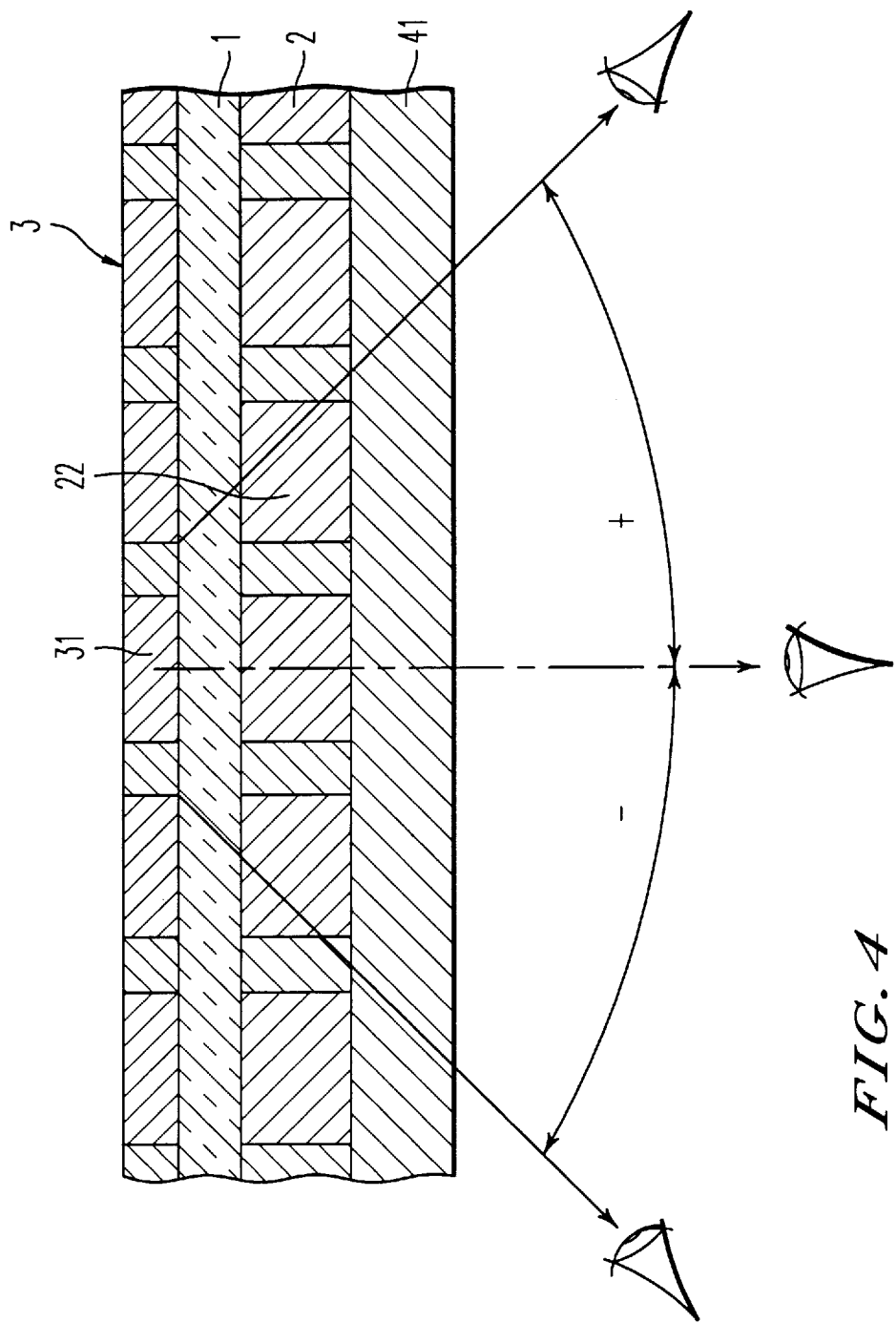
FIG. 4 is a sectional view for explaining the angle of view used in the present invention.

If $d_1 > d_2$ as shown in the FIG. 3(a), light emitted from one of the organic EL elements 31 enters not only into an objective color conversion layer 22a directly opposed to one of the organic elements 31 but also into a color conversion layer 22b adjacent to the color conversion layer 22a because the light is isotropically extended. Therefore, light with mixed colors is viewed. Specifically, the angle of view (see FIG. 4) becomes narrow.

Alternatively, if $d_2 \geq d_1$ as shown in FIG. 3(b), the emitted light has a wide angle to enter into the adjacent color conversion layer 22b. This ensures the light will have less mixed colors thereby allowing the light with a desired color to be viewed at a wide angle. Specifically, the angle of view becomes wide, which provides a preferable condition.

Also, it is desirable that the film thickness $T_1$ of the shielding layer 21 and the thickness $T_2$ of the color conversion layer 22 have a relation satisfying the equation, $T_1 \geq T_2$. FIGS. 5(a)–5(c) shows cases where $T_1 < T_2$.

In the case shown in the FIG. 5(a), light emitted from one of the organic EL elements 31, not shielded by the shielding layer 21, enters into an adjacent and projecting color conversion layer 22b. Therefore, the light with mixed colors is viewed so that light with a desired color can be viewed only at a narrow angle. Specifically, the angle of view becomes narrow.

In the case shown in the FIG. 5(b), the light emitted from one of the organic EL elements 31 must have a wide angle to enter into the adjacent color conversion layer 22b. If the light resolved and converted by the color conversion layer 22a passes through an adjacent conversion layer 22b, the light with mixed colors is viewed so that light with a desired color can be viewed only at a narrow angle. Specifically, the angle of view is narrow. The color conversion layer 22 formed of layers emitting a fluorescent light, such as a fluorescent layer, further promotes this phenomenon.

In the case shown in the FIG. 5(c), light emitted from the organic EL elements 31 and the light passing through the color conversion layer 22a together enter into the color conversion layer 22b. Resultantly, the angle of view becomes narrow.

On the other hand, FIGS. 5(d)–5(f) show cases where $T_1 \geq T_2$. Among light rays emitted from the organic EL elements 31, those having a considerably large angle are shielded by the shielding layer 21 so that these do not enter into the color conversion layer 22b. The light emitted from the color conversion layer 22a is also shielded by the shielding layer 21. Therefore, the light having less mixed colors is viewed thereby allowing light with a desired color to be viewed at a wide angle. The angle of view becomes wide, which provides a preferable condition.

Also, illustrating the relation between the emitting area $S_1$ of the organic EL elements 31 and the area $S_2$ of the color conversion layer 22, it is desirable that the equation, $S_2 \geq S_1$ be satisfied.

Here, the equation $S_2 \geq S_1$ means that in the relation between the color conversion layer 22 and the corresponding organic EL element 31, the area of the color conversion layer 22 is the same as the area of the luminescent area of the organic EL element 31 or greater than an area capable of involving the luminescent area.

For example, FIG. 6 is a view of the multicolor luminescent device of the present invention which is viewed from the emitting surface.

Figure 6A:
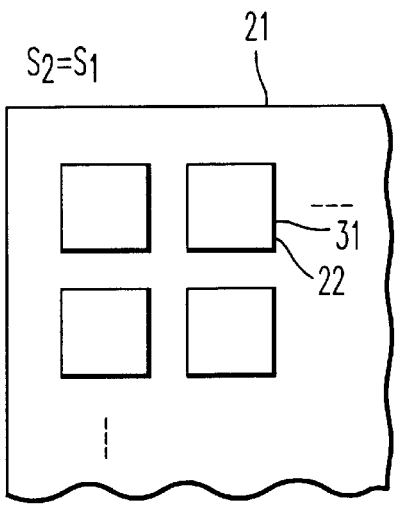
Figure 6D:
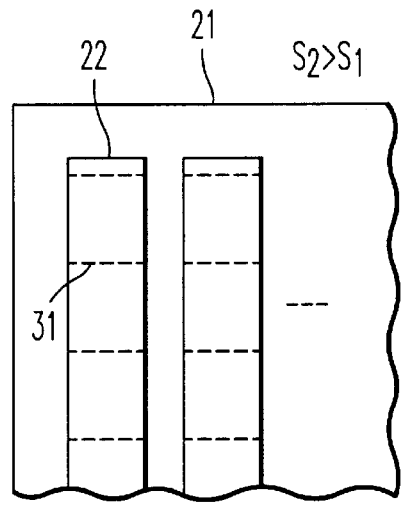
Figure 6B:
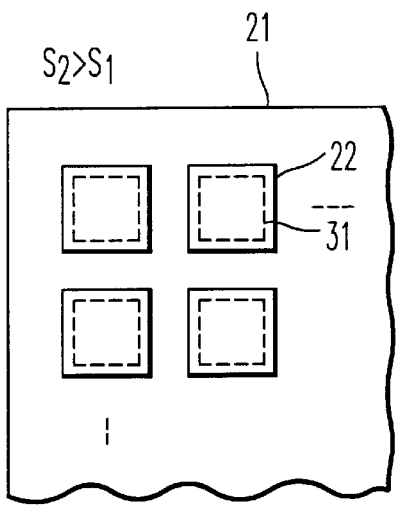
Figure 6E:
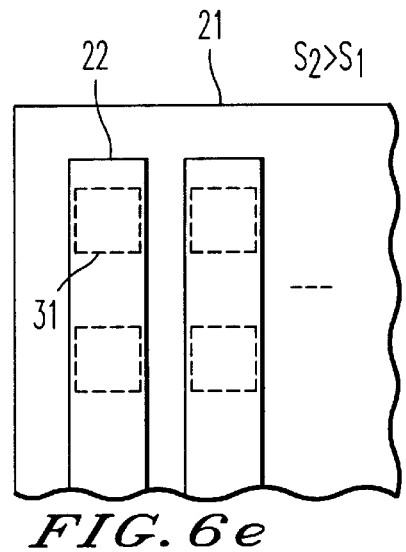

FIG. 6(a) shows a case where $S_2 = S_1$, that is, the area of the color conversion layer 22 is the same as the area of the luminescent area of the organic EL element 31. FIGS. 6(b)–6(e) show cases where the area of the color conversion layer 22 is greater than the area of the organic EL element.

If $S_1 > S_2$ as shown in FIG. 7(a), light emitted from one of the organic EL elements 31 tends to be incident to the adjacent color conversion layer 22b at a narrow angle. Therefore, the light having mixed colors is viewed so that light with a desired color can be viewed only at a narrow angle. This presents a condition that the angle of view is narrow.

On the other hand, when $S_2 > S_1$ as shown in FIG. 7(b), among the emitted light rays, those having a considerably wide angle can be shielded. This ensures that the light will have less mixed colors so that light with a desired color can be viewed at a wide angle. Therefore, the angle of view is large, which presents an advantageous condition.

2. Structural elements (1) Color conversion layer

The color conversion layer used in the present invention may be a color filter 5 which resolves and cut off light emitted from the organic EL elements 31, or a fluorescent layer 6 which absorbs the light emitted from the organic EL elements 31 and converts it to fluorescent light with a different color (long wave light) as shown in FIG. 8(a), 8(b).

However, use of the color filter 5 causes enormous loss of light because the light is resolved and cut off, to be discharged from the color filter. For example, if the emitting white light is resolved into three primary colors (red, green, and blue), the luminosity of the white light is reduced almost to ⅓.

On the other hand, the fluorescent layer 6 has a function of absorbing light and converting it to fluorescent light of a longer wave length. Supposing the light absorbing efficiency of the fluorescent layer as 80%, when the fluorescent layer emits light at an 80% yield of fluorescence, the light can be converted to light with a long wave length at a yield of 64%. Such a fluorescent layer is in actual use.

Accordingly, it is desirable to use the fluorescent layer 6 as the color conversion layer. Also, the fluorescent layer 6 itself emits isotropic light thereby allowing the angle of view to be wide and the visibility to be promoted as used for the multicolor luminescent device. Therefore, the fluorescent layer is superior to the color filter 5.

Next, as materials used for the color filter, the independent types of coloring matter illustrated below or solids in which coloring matter is dissolved and dispersed in a binder resin are given.

Red coloring matter (hereinafter abbreviated as (R)):

Perylene type pigments, lake pigments, azo type pigments, quinacridone type pigments, anthraquinone type pigments, anthracene type pigments, isoindoline type pigments, and isoindolinone type pigments. These compounds may be used independently or in combinations of two or more.

Green coloring matter (hereinafter abbreviated as (G)):

Polyhalogenide phthalocyanine type pigments, polyhalogenide copper phthalocyanine type pigments, triphenylmethane type basic dyes, isoindoline type pigments, and isoindolinone type pigments. These compounds may be used independently or in combinations of two or more.

Blue coloring matter (hereinafter abbreviated as (B))

Copper phthalocyanine type pigments, indanthrone type pigments, indophenol type pigments, cyanine type pigments, and dioxazine type pigments. These compounds may be used independently or in combinations of two or more.

On the other hand, as the binder resin, transparent materials (transmittance of visible rays: more than 50%) are preferable. Given as examples of these transparent binder resins macromolecule are polymethyl methacrylate, polyacrylate, polycarbonate, polyvinyl alcohol, polyvinyl pyrrolidone, hydroxyethyl cellulose, and carboxymethyl cellulose.

Incidentally, photosensitive resins which can be used in photolithography are selected to separately dispose color filters on the same flat. For example, photocurable resist materials having a reactive vinyl group such as an acrylate type, methacrylate type, vinyl polycinnamate type, and cyclic rubber type are given as the photosensitive resins. When using a printing method, printing inks (medium) using a transparent resin are selected. Given as examples of these printing inks are compositions including transparent resins such as a polyvinyl chloride resin, polyvinylidene chloride resin, melamine resin, phenol resin, alkyd resin, epoxy resin, polyurethane resin, polyester resin, maleic acid resin; monomers, oligomers, or polymers of a polyamide resin; polymethyl methacrylate, polyacrylate, polycarbonate, polyvinyl alcohol, polyvinyl pyrrolidone, hydroxyethyl cellulose, and carboxymethyl cellulose.

The color filters are commonly manufactured by the following processes. Color filters mainly composed of coloring matter are manufactured by forming a film using a vacuum deposition method or a sputtering method through a mask on which a desired pattern for the color filter is formed. On the other hand color filters composed of coloring matter and a binder resin are manufactured by mixing a fluorescent coloring matter, the above resin, and an appropriate solvent, dispersing or solubilizing to allow the mixture to be liquefied, forming a film using a spin coating method, roll coating method, or casting method, and patterning with a desired pattern for the color filter using a photolithographic method or a printing method. The color filters are finally manufactured by curing the film by heat-treating.

Preferable film thickness and transmittance of the color filters are as follows:

R: film thickness of 0.5–5.0 µm(transmittance of more than50%/wavelength of 610 nm), G: film thickness of 0.5–5.0 µm(transmittance of more than 50%/wave length of 545 nm), B: film thickness of 0.2–5.0 µm(transmittance of more than 50%/wave length of 460 nm).

In particular, for color filters composed of coloring matter and a binder, the concentration of the coloring matter may be in the range to the extent that the patterning of the color filter is easily performed and the light emitted from the organic EL elements can be transmitted. It is desirable that the coloring matter be contained in an amount of 5–50% by weight in the film of the color filter including the binder resin although it depends on sorts of the coloring matter.

The fluorescent layer is composed of, for example, fluorescent coloring matter and a resin or of independent fluorescent coloring matter. The fluorescent layer composed of the fluorescent coloring matter and the resin are, for examples a solid type produced by dissolving or dispersing the fluorescent coloring matter in the pigment resin and/or the binder resin.

Specific examples of types of the coloring matter will be explained. First illustrating near ultraviolet rays, given as examples of the coloring matter converting violet emission of the organic EL elements to blue emission are stilbene type coloring matter such as 1,4-bis(2-methyl styryl) benzene (hereinafter abbreviated as (Bis-MSB)) and trans-4,4'-diphenyl stilbene (hereinafter abbreviated as (DPS)) and coumarin type coloring matter such as 7-hydroxy-4-methyl coumarin (hereinafter abbreviated as (coumarin 4)).

Given as examples of the coloring matter converting blue or blue-green emission of the organic EL elements to green emission are coumarin type coloring matter such as 2,3,5, 6-1H, 4H-tetrahydro-8-trifluoromethylquinolizino(9,9a,1-gh)coumarin (hereinafter abbreviated as (coumarin 153)), 3-(2'-benzothiazolyl)-7-diethylaminocoumarin (hereinafter abbreviated as (coumarin 6), and 3-(2'-benzimidazolyl)-7-N,N'-diethylaminocoumarin (hereinafter abbreviated as (coumarin 7)), other coumarin coloring matter type dyes such as basic yellow 51, and naphthalimide type coloring matter such as solvent yellow 11 and solvent yellow 116.

Given as examples of coloring matter converting blue-green emission of the organic EL elements to orange-red emission are cyanine type coloring matter such as 4-dicyanomethylene-2-methyl-6-(p-dimethylaminostyryl)-4H-pyran (hereinafter abbreviated as (DCM)), pyridine type coloring matter such as 1-ethyl-2-(4-(p-dimethylaminophenyl)-1,3-butadienyl)-pyridinium-perchlorate (hereinafter abbreviated as (pyridine 1)), rhodamine type coloring matter such as rhodamine B and rhodamine 6G, and oxazine type coloring matter.

Further, various dyes (direct dye, acidic dye, basic dye, disperse dye) can be used provided that they exhibit fluorescence.

Also, pigmental materials in which the above fluorescent coloring matter is kneaded in advance in a pigmental resin such as polymethacrylate ester, polyvinyl chloride, vinyl chloride-vinyl acetate copolymer, alkyd resin, aromatic sulphonamide resin, urea resin, melamine resin, benzoguanamine resin, or the like may be used.

In addition, these types of fluorescent coloring matter and pigments may be, as required, used either independently or in combinations. The conversion rate of the fluorescent coloring matter to red color is low. By mixing the above pigments, the rate of conversion from light emission to fluorescent emission can be increased.

On the other hand, as the binder resin, transparent materials (transmittance of visible rays: more than 50%) are preferable. Given as examples of such transparent materials are transparent resins (high polymer) such as polymethyl methacrylate, polyacrylate, polycarbonate, polyvinyl alcohol, polyvinyl pyrrolidone, hydroxyethyl cellulose, and carboxymethyl cellulose.

Incidentally, photosensitive resins which can be used in photolithography are also selected to separately dispose the fluorescent layers on the same flat. For example, photocurable resist materials having a reactive vinyl group such as an acrylate type, methacrylate type, vinyl polycinnamate type, and cyclic rubber type are given as the photosensitive resins. When using a printing method, printing inks (medium) using a transparent resin are selected. Given as examples of these transparent resins such as a polyvinyl chloride resin, melamine resin, phenol resin, alkyd resin, epoxy resin, polyurethane resin, polyester resin, maleic acid resin, monomers, oligomers, ans polymers of a polyamide resin; polymethyl methacrylate, polyacrylate, polycarbonate, polyvinyl alcohol, polyvinyl pyrrolidone, hydroxyethyl cellulose, and carboxymethyl cellulose.

The fluorescent layers are commonly manufactured by the following processes. The fluorescent layers mainly composed of fluorescent coloring matter are manufactured by forming a film using a vacuum deposition method or a sputtering method through a mask on which a desired pattern for the fluorescent layers is formed. On the other hand, the fluorescent layers composed of fluorescent coloring matter and a resin are manufactured by mixing fluorescent coloring matter, a resin, and an appropriate solvent, dispersing or solubilizing to allow the mixture to be liquefied, forming a film using a spin coating method, roll coating method, or casting method, and patterning with a desired pattern for the fluorescent layers using a photolithographic method or a screen printing method.

There are no limitations to the thickness of the fluorescent layers to the extent that the emission of the organic EL elements is sufficiently absorbed and the functions of emitting fluorescent light is not impaired. The thickness of the fluorescent layers is in a range of from 10 mm to 1 mm, preferably from 1 μm to 1 mm, and more preferably from 10 μm to 100 μm. Generally, the thickness of the fluorescent layers is slightly greater than that of the color filters for the following reasons. The fluorescent coloring matter is more sensitive to concentration compared with the coloring matter for the color filters so that it is preferable to disperse or solubilize the fluorescent coloring matter in less concentration in a pigmental resin or a binder resin to promote fluorescence. However, because the fluorescent layers must sufficiently absorb the emission of the organic EL elements, it is necessary for them to have almost the same absorbance as the color filters. As a result, it is desirable that the thickness of the fluorescent layers be greater according to the following Lambert-Beer formula (1) when the absorption coefficient of the coloring matter is constant. The concentration of the fluorescent coloring matter including the pigmental resin and/or the binder resin is in a range of from 1 to $10^{-4}$ mol/kg, preferably from 0.1 to $10^{-3}$ mol/kg, and more preferably from 0.05 to $10^{-2}$ mol/kg though it depends on the type of the fluorescent coloring matter.

Lamber-Beer formula $$A = \epsilon c l \quad (1)$$

wherein A represents absorbance, e represents a absorption coefficient (peculiar to coloring matter), c represents concentration, and l represents thickness.

(2) Shielding layers

In the present invention, the shielding layers are used for shielding the light emitted from the organic EL elements to avoid the color mixing in the multicolor luminescent device and to promote desirable characteristics in the angle of view.

The thickness of the shielding layer is generally in a range of from 10 nm to 1 mm, preferably from 1 μm to 1 mm, and more preferably from 10 μm to 100 μm. When using a fluorescent layer as the color conversion layer, a larger film thickness is required in comparison with the color filters.

It is especially desirable that the thickness of the fluorescent layer be in a range of from 10 μm to 100 μm. Therefore, it is desirable that the thickness of the shielding layer be 10 μm or more according to the equation, $T_2 \geq T_1$, which is defined in advance based on the relation between the film thickness $T_1$ of the color conversion layer (fluorescent layer) and the thickness $T_2$ of the shielding layers. The surface shape of the shielding layers may be either lattice or stripe, though lattice is preferable (see FIGS. 1(b) and 1(c)).

Also, the sectional shape of the shielding layers 21 is generally rectangular as shown in FIG. 9(a). However, it is desirable to form the shielding layers 21 so that the width of the shielding layers in section is reduced slowly or gradually from the side of the transmittable medium towards the opposite side. By this measure, the openings of the color conversion layers 22 can be enlarged while desirable characteristics in the angle of view are maintained. Also, light from the organic EL elements 31 is efficiently utilized to increase the luminance of the multicolor luminescent device and thereby to improve the visibility.

Specifically, as shown in FIGS. 9(b) and 9(c), the width $d_2$ of the shielding layer 21 at the side of the transmittable medium is different from and greater than the width of the shielding layer 21 at the opposite side. By this measure, light shielded when the sectional shape is rectangular can be utilized and the openings of the color conversion layers 22 can be enlarged to increase the luminance of the multicolor luminescent device and thereby to improve the visibility. FIGS. 9(b) and 9(c) respectively show sectional shapes of the shielding layers which are inversely trapezoid and cross-shaped.

It is desirable that the transmittance of the shielding layers be 10% or less in the region of light emitted from the organic EL elements or the color conversion layers, specifically, in a visible region of a wave length ranging from 400 nm to 700 nm. If the transmittance exceeds 10%, the light emitted from a color conversion layer or an organic EL element enters not only into the corresponding front color conversion layer but also into the adjacent color conversion layer. This means that the functions of the shielding layers are not attainable.

Further, at least the reflectance of the shielding layers at the side connecting to the color conversion layers in a visible region of a wave length ranging from 400 nm to 700 nm is preferably 10% or more, more preferably 50% or more. For example, as shown in FIG. 10(b), a reflective portion 7 to be provided allows light from the color conversion layers 22 to be efficiently discharged and thereby promotes the luminance of the multicolor luminescent device and improves the visibility.

Also, as shown in FIG. 10(c), it is more effective to dispose the reflective portion 7 and also to form the shielding layer with an inverse trapezoidal shape. Incidentally, FIG. 10(a) shows a case where a reflective portion is not disposed.

As examples of materials used for the shielding layers, the following metals and black coloring matter are given.

Given as examples of the metals are Ag, Al, Au, Cu, Fe, Ge, In, K, Mg, Ba, Na, Ni, Pb, Pt, Si, Sn, W, Zn, Cr, Ti, Mo, Ta, and stainless steel. These metals may be used independently or in combinations of two or more. Also, alloys of these metals may be used. Furthermore, oxides, nitrides, sulphides, nitrates, and sulfates of the above metals, for example, $TiO_2$, $BaSO_4$ or the like may be used. Also, carbon may be included as required.

The above materials are formed into a film on the transparent substrate using a sputtering method, vapor deposition method, CVD method, ion plating method, electric deposition method, electroplating method, chemical plating method, and the like. Patterning of the film is carried out using a photolithographic method to form a pattern in which shielding layers are separately disposed on the same flat.

As the black coloring matter, carbon black, titan black, aniline black, and compounds produced by mixing and blackening the above coloring matter for the color filters are exemplified.

This black coloring matter or the above metals are dissolved and dispersed in the binder resin which is used for the above color conversion layers to make a solid material. Then, patterning is performed on the solid material in the same manner as for the color conversion layers to form the pattern of the shielding layers.

The following explanation is for a preferred embodiment especially of the method for gradually or slowly reducing the width of the shielding layer from the side of the transmittable medium toward the opposite side to form the shape of the shielding layer.

For example, the shielding layer in which black coloring matter is dissolved or dispersed in a binder resin such as a photocurable resist can be produced by directing ultraviolet light from above a film (the side of the transmittable medium) controlling light energy for exposure and developing conditions after producing the film on a substrate. This process is carried out under conditions of less exposure, higher concentration, higher temperature, and longer developing time than those in a process for forming a rectangular shielding layer.

Because the film is a shielding layer by nature, even light in the ultraviolet region can hardly be transmitted through the film so that the nearer a part of the film is to an exposure surface, the more advanced the photocuring of the part, and the farther a part of the film from the exposure surface, the more inhibited the photocuring of the part. Therefore, the film can be formed into a desired shape because dissolution of the part (opposite side of the transmittable medium) of the film far from the exposure surface is advanced by treating with a developing solution.

In a case where the shielding layer is made from a metal, a pattern may be formed by the following process. First, a rectangular or trapezoidal pattern is formed on a substrate using a photosoluble resist (positive resist). After forming a film of the metal, the resist pattern is lifted off and then a desired pattern for the shielding layer is formed in gaps of the resist pattern.

In addition, at least the reflectance of the shielding layers at the side connecting to the color conversion layers in the visible region of a wave length ranging from 400 nm to 700 nm is preferably 10% or more.

The pattern of the shielding layer is formed by only using the above metal or by forming a film with the above metal, of a pattern of a shielding layer composed of black coloring matter or a mixture of black coloring matter and a binder resin using a sputtering method, vapor deposition method, CVD method, ion plating method, or the like. In the latter case, it is necessary to selectively form a film on the side of the shielding layer. Therefore after forming a film with a thin resist on parts other than the side thereof, a film of the above metal is obliquely formed on the resist. Then, the metal film formed in unnecessary locations is removed by lifting off the resist to produce a desired shielding layer. In this instance, the film thickness is in a range of from 0.01 $\mu$m to 1 $\mu$m, preferably from 0.05 $\mu$m to 0.5 $\mu$m, to improve the uniformity and the adhesion.

Here, the film surface reflectance of major metallic materials is shown in Table 1.

TABLE 1

| Metal | Reflectance (Wave length nm) | Metal | Reflectance (Wave length nm) |
|---|---|---|---|
| Ag | 97.9% (500) | Na | 98.2% (546) |
| Al | 91.6% (546) | Ni | 54.6% (440) |
| Au | 50.4% (500) | Ni | 60.7% (540) |
| Cu | 62.5% (500) | Pb | 67.5% (700) |
| Fe | 60.7% (570) | Pt | 59.1% (589) |
| Ge | 46.6% (516) | Si | 37.5% (515) |
| In | 51.5% (500) | W | 43.1% (472) |

TABLE 1-continued

| Metal | Reflectance (Wave length nm) | Metal | Reflectance (Wave length nm) |
|---|---|---|---|
| K | 88.6% (546) | Zn | 82.5% (545) |
| Mg | 84.3% (546) | | |

The reflectance of these metals is limited to that at a certain wave length. However, there is no large difference in the reflectance at a wave length ranging from 400 nm to 700 nm. In addition, materials other than the above materials may be used if their reflectance is more than 10%.

(3) Transmittable medium

A transmittable medium is a material for mediating between the organic EL elements and the color conversion layers together with the shielding layers. As the transmittable medium, materials having a light transmittance of more than 50% at a wave length of from 400 nm to 700 nm are preferable. Also, insulating materials satisfying the above characteristics are more preferable.

The transmittable medium may have either a single layer structure or a multilayer structure. Also, the condition of the transmittable medium may be any one of a solid phase, a liquid phase, and a vapor phase.

If the transmittable medium is formed of a layer of polymer, specifically polymers having an acrylate or methacrylate type reactive vinyl group such as photocurable resins and/or heat-curable resins are given.

Also, given as examples of the polymer used for the transmittable medium are transparent resins such as a melamine resin, phenol resin, alkyd resin, epoxy resin, polyurethane resin, polyester resin, maleic acid resin; monomers, oligomers, or polymers of a polyamide resin; polymethyl methacrylate, polyacrylate, polycarbonate, polyvinyl alcohol, polyvinyl pyrrolidone, hydroxyethyl cellulose, and carboxymethyl cellulose. Also, various fluoropolymers can be used.

The transmittable medium can be formed of an inorganic oxide layer. Given as specific examples of the inorganic oxide are silicon oxide ($SiO_2$), aluminum oxide ($Al_2O_3$), titanium oxide ($TiO_2$), yttrium oxide ($Y_2O_3$), germanium oxide ($GeO_2$), zinc oxide (ZnO), magnesium oxide (MgO), calcium oxide (CaO), boron oxide($B_2O_3$), strontium oxide (SrO), bariumoxide (BaO), leadoxide (PbO), zirconiumoxide ($ZrO_2$), sodium oxide ($Na_2O$), lithium oxide ($Li_2O$), and potassium oxide ($K_2O$).

Also, a glass plate may be used as the inorganic oxide layer. This glass plate is used as a transmissible support substrate shown in the FIG. 2(a).

Specifically, soda-lime glass, glass containing barium and strontium, lead glass, aluminosilicate glass, borosilicate glass, barium borosilicate glass, and the like are exemplified. Incidentally, the inorganic oxide layer may be a layer containing an inorganic oxide as a major component and may include a nitride, for example, $Si_3N_4$.

In addition, the following adhesive agents can be used to secure the organic EL elements to a transmissible support substrate 41 provided with the color conversion layers and the shielding layers.

Given as specific examples of adhesive agents are photocurable or heat-curable adhesives having a reactive vinyl group of acrylic acid type or methacrylic acid type oligomer and moisture-curable resins such as 2-cyanoacrylate. Also, heat-curable or chemically curable resins (two liquid mixing type) such as compounds of an epoxy type may be given as examples of the adhesive agents.

Given as examples of the transmittable media of a vapor phase and a liquid phase are inert gases such as nitrogen and argon and inert liquids such as hydrocarbon fluoride and silicone oil. Also, the transmittable media may be vacuum spaces.

These transmittable media are formed using a spin coating method, roll coating method, or casting method in the case of using a liquid material and a sputtering method, vacuum deposition method CVD method, or ion plating method in the case of using a solid material.

The inert gas or liquid is sealed in by sealing an area other than the luminescent area of the multicolor luminescent device.

It is preferable that a boundary layer of the transmittable media at the side of the organic EL elements be formed of the above inorganic oxide layer or inert gas or inert liquid to shield from water and oxygen gas which promote deterioration of the organic EL elements.

Also, it is desirable that the difference between the refractive index $n_1$ of the transmittable medium connecting with the color conversion layer and the refractive index $n_2$ of the color conversion layer be small. As the difference becomes smaller, less and less the light emitted from the organic EL elements is reflected by the color conversion layer thereby allowing a lot of light to enter into the conversion layer. It is desirable to satisfy the following equation.

$$|n_1-n_2|<0.4$$

If $|n_1-n_2|\geq 0.4$, the reflectance of light emitted from the organic EL elements becomes large at the boundary layer of the color conversion layer as defined in formula (2), allowing the luminance of light finally discharged from the conversion layer to be reduced.

Here, the refractive index $n_1$ of major materials used for the transmittable medium and the refractive index $n_2$ of major resins and binder resins used for the color conversion layer are shown in Table 2.

TABLE 2

| Transmittable medium | $n_1$ (Wave length) |
|---|---|
| Methyl methacrylate resin | 1.49 (589 nm) |
| SiO2 | 1.54 (589 nm) |
| B₂O₃ | 1.77 (546 nm) |
| Glass | 1.52 (588 nm) |
| Tetrafluoroethylene resin | 1.35 (589 nm) |
| Hydrocarbon fluoride (Fc 70) | 1.30 (589 nm) |
| Silicone oil | 1.40 (589 nm) |
| Nitrogen gas | 1.00 (546 nm) |
| Argon gas | 1.00 (546 nm) |
| Air | 1.00 (546 nm) |
| Vacuum | 1.00 (546 nm) |

TABLE 3

| Color conversion layer (Pigment resin, Binder resin) | $n_2$ (Wave length) |
|---|---|
| Vinyl chloride resin | 1.54 (589 nm) |
| Vinylidene chloride resin | 1.60 (589 nm) |
| Vinyl acetate resin | 1.45 (589 nm) |
| Polyethylene resin | 1.51 (589 nm) |
| Polyester resin | 1.52 (589 nm) |
| polystyrene resin | 1.59 (589 nm) |
| Methyl methacrylate resin | 1.49 (589 nm) |
| Melamine resin | 1.60 (589 nm) |

Since there are no large differences in the above refractive indexes at wave lengths ranging from 400 nm to 700 nm, the refractive indexes at the above wave lengths may represent refractive indexes at wave lengths ranging from 400 nm to 700 nm.

Incidentally, the relation between the reflectance (R) and each refractive index is shown in Formula (2).

$$R(\text{Reflectance *}) = \frac{(n_1-n_2)^2}{(n_1+n_2)^2} * \text{Vertical reflectance} \quad (2)$$

(4) Support substrate

A support substrate 4 or a support substrate 41 shown in the FIGS. 2(a)–2(c) is a substrate for supporting the multicolor luminescent device. It is particularly preferable that the support substrate 41 which transmits light emitted from the organic EL elements and the color conversion layers have a transmittance of more than 50% in a region of visible rays of a wave length ranging from 400 nm to 700 nm. On the other hand, the support substrate 4 shown in FIG. 2(c) is unnecessarily transmits light because it is not located at the side discharging the light.

Typical examples of materials used for the support substrate are a glass plate, substrates composed of polymer materials, or the like.

There are no limitations to the thickness of the support substrate because it has no influence on the angle of view. However, a too thick substrate has a certain influence on the transmittance of light. Therefore, it is desirable to select the thickness in a range of from 1 μm to 5 mm.

(5) Organic EL elements

In organic EL elements used in the present invention, those having at least a recombination region and an emitting region are used as organic compound layers. Since the recombination region and the emitting region generally exist in an emitting layer, only the emitting layer may be used as the organic compound layer in the present invention. However, other than the emitting layer, for example, a positive hole injection layer, electron injection layer, organic semiconductor layer, electron barrier layer, stick improving layer, or the like can be utilized as required.

Typical structures for the organic EL elements used in the present invention will be explained. However, this shall not be construed as limiting the invention.

(a) A structure composed of an anode, an emitting layer, and a cathode.

(b) A structure composed of an anode, a positive hole injection layer, an emitting layer, and a cathode.

(c) A structure composed of an anode, an emitting layer, an electron injection layer, and a cathode.

(d) A structure composed of an anode, a positive hole injection layer, an emitting layer, an electron injection layer, and a cathode.

(e) A structure composed of an anode, an organic semiconductor layer, an emitting layer, and a cathode.

(f) A structure composed of an anode, an organic semiconductor layer, an electron barrier layer, an emitting layer, and a cathode.

(g) A structure composed of an anode, a positive hole injection layer, an emitting layer, a stick improving layer, and a cathode.

Among these structures, the structure (d) is preferably used.

(5)-1 Anode

An anode using, as an electrode material, metals, alloys, electroconductive compounds, and mixtures of these which have a high work function (more than 4 eV) are preferably used. Given as examples of such an electrode material are metals such as Au and electroconductive materials such as CuI, ITO, $SnO_2$, and ZnO.

A thin film of each of these electrodes is formed by means of vapor deposition, sputtering, or the like to produce the anode.

If light emitted from the emitting layer is taken from the anode in this manner, it is desirable that the transmittance of the anode for the emitted light be more than 10%. Also, the sheet resistance of the anode is preferably less than several hundreds $\Omega/\square$. The thickness of the anode is usually from 10 nm to 1 $\mu$m, preferably from 10 nm to 200 nm, although this depends on the material used.

(5)-2 Emitting layer

Major emitting materials of the organic EL elements are organic compounds. As specific examples of the organic compounds used for the emitting layer, the following compounds are given, depending on the desired color.

First, emitting light of a violet color to the ultraviolet region can be prepared using the organic compounds represented by the following general formula.

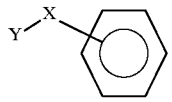

wherein X represents the following compound.

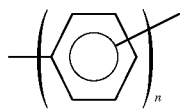

(wherein n denotes 2, 3, 4, or 5) and Y represents the following compound.

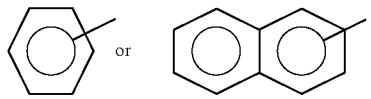

In the above compounds, a phenyl group, phenylene group, and naphthyl group may be substituted with one or more alkyl groups having from 1 to 4 carbon atoms, alkoxy groups, hydroxyl groups, sulphonyl groups, carbonyl groups, amino groups, dimethylamino groups, and diphenylamino groups. Also, these groups may be combined to form a saturated five-membered ring or a saturated six-membered ring. Further, it is preferable that the phenyl group, phenylene group, and naphthyl group are substituted at a para position so as to be easily substituted and to form a smooth deposition film. The compounds represented by the following formula are given as examples of the compounds substituted at a para position. Among these compounds, p-quarterphenyl derivatives and p-quinquephenyl derivatives are preferable.

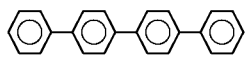

p-Quarterphenyl(PQP)

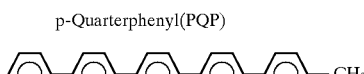

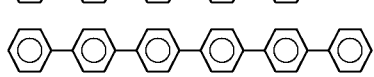

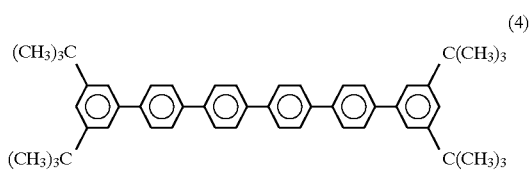

3,5,3'''',5'''' -tetra-t-butyl-p-sexiphenyl(TBS)

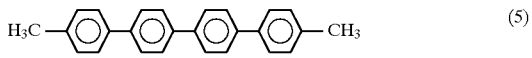

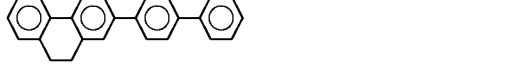

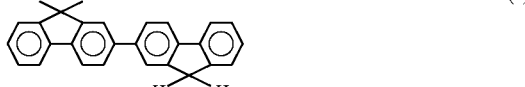

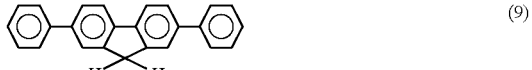

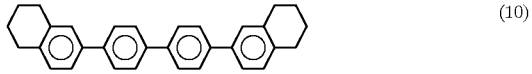

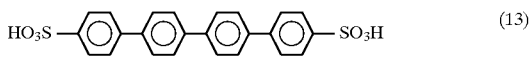

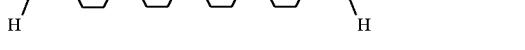

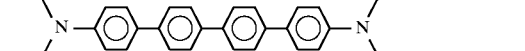

3,5,3'''',5'''' -tetra-t-butyl-p-quinquephenyl

Next, given as examples of the organic compounds used for producing emitting light of a blue color to a green color are fluorescent bleaching agents such as a benzothiazole type, benzoimidazole type, and benzoxazole type; metal chelated oxinoid compounds, and styryl benzene type compounds.

Illustrating specific compounds, for example, the compounds disclosed in Japanese Patent Application Laid-open No. 194393/1984 are given. Among these, typical examples are fluorescent bleaching agents such as a benzoxazole type, benzothiazole type, and benzoimidazole type.

In addition, other useful compounds are enumerated in Chemistry of Synthetic Dyes, 628-637, P640, (1971).

As the above-mentioned chelated oxinoid compounds, the compounds disclosed in Japanese Patent Application Laid-open No. 29569/1988 can be used. Among these, typical examples are 8-hydroxyquinoline type metal complexes such as tris (8-quinolinol) aluminum (hereinafter abbreviated as (Alq)).

As the above-mentioned styryl benzene type compounds, the compounds disclosed in the specifications of EPCs No. 0319881 and No. 0373582 can be also used.

Further, distyryl pyrazine derivatives disclosed in Japanese Patent Application Laid-open No. 252793/1990 can be used as the material for the emitting layer.

In addition, the polyphenyl type compounds disclosed in the specification of EPC No. 0387715 can be used as the material for the emitting layer.

Other than the above-mentioned fluorescent bleaching agents, metal chelated oxinoid and styryl benzene, the following compounds can be used as the material for the emitting layer:

12-phthaloperinone (J. Appl. Phys., Vol 27, P713, (1988)), 1,4-diphenyl-1,3-butadiene, 1,1,4,4-tetraphenyl-1,3 butadiene(Appl. Phys. Lett., Vol 56, P799, (1990)), naphthalimide derivatives (Japanese Patent Application Laid-open No. 305886/1990), perillene derivatives (Japanese Patent Application laid-open No. 189890/1990), oxadiazole derivatives (Japanese Patent Application Laid-open No. 216791/1990 or oxadiazole derivatives disclosed by Hamada et al. at the conference of Apply. Phy), aldazine derivatives (Japanese Patent Application Laid-open No. 220393/1990), pyraziline derivatives (Japanese Patent Application Laid open No. 220394/1990), cyclopentadiene derivatives (Japanese Patent Application Laid-open No. 289675/1990), pyrrolopyrrole derivatives (Japanese Patent Application Laid-open No. 296891/1990), styrylamine derivatives (Appl. Phys. Lett., Vol 56, P799, (1990)), coumarine type compounds (Japanese Patent Application Laid-open No. 191694/1990), and macromolecular compounds described in the International Disclosure Official Gazette or Apply. Phys. Lett., Vol 58, 18, P1982 (1991).

In the present invention, as the materials used for the emitting layer, aromatic dimethylidine type compounds (compounds disclosed in the specification of EPC No. 0388768 or Japanese Patent Application Laid-open NO. 231970/1991) are preferably used. Specific Examples of such compounds are 4,4'-bis(2,2-di-t-butylphenylvinyl) biphenyl (hereinafter abbreviated as (DTBPBBi)), 4,4'-bis (2,2-diphenylvinyl)biphenyl (hereinafter abbreviated as (DPVBi), and derivatives of these.

Also, the compounds represented by the general formula $(R_s\text{-}Q)_2\text{-}AL\text{-}O\text{-}L$, which are described in Japanese Patent Application Laid-open No. 258862/1993 can be used, wherein L represents a hydrocarbon having 6–24 carbon atoms and including a phenyl group, O-L represents a phenolate ligand, Q represents a substituted 8-quinolinolate ligand, Rs represents an 8-quinolinolate ring substitutional group selected to stereo-chemically prevent three or more substituted 8-quinolinolate ligands from binding with an aluminum atom.

Given as specific examples of such compounds are bis (2-methyl-8-quinolinolate)(para-phenylphenolate) aluminum (III) (hereinafter abbreviated as (PC-7)) and bis(2-methyl-8-quinolinolate)(1-naphtholate) aluminum (III) (hereinafter abbreviated as (PC-17)).

In addition, Japanese Patent Application Laid-open No. 9953/1994 discloses a method for producing mixed emitting light of a blue color and a green color using doping in an efficient manner. When using this method for forming the emitting layer of the present invention, the above-mentioned emitting material is used as a host. As a dopant, strongly fluorescent coloring matter of a blue color to a green color, for example, a coumarin type or fluorescent coloring matter similar to those used in the above method can be given. Specifically, as the host, fluorescent materials mainly composed of distyryl arylene, preferably, for example, DPVBi can be given. As the dopant, diphenylaminovinyl arylene, preferably, for example, N,N'-diphenylaminovinyl benzene (DPAVB) can be given.

There are no limitations to an emitting layer providing a white emitting light. The following compounds are typical examples of the emitting layer capable of emitting light of a white color.

(1) An emitting layer in which the energy level of each layer of a structure composed of laminated organic EL layers is defined and tunnel injection is utilized to emit light (EPC Laid-open No. 0390551)

(2) A device in which tunnel injection is utilized in the same way as for the emitting layer (1) to emit emitting light of a white color, which is illustrated in Examples (Japanese Patent Application Laid-open No. 230584/1991).

(3) An emitting layer having a two-layer structure (Japanese Patent Applications Laid-open No. 220390/1990 and No. 216790/1990)

(4) An emitting layer divided into plural layers each composed of a different material capable of emitting light of a different wave length (Japanese Patent Application Laid-open No. 51491/1992)

(5) An emitting layer in which a blue light emitting layer (fluorescent peak at a wave length of 380 nm–480 nm) and a green light emitting layer (wave length: 480 nm–580 nm) are laminated, further comprising a red fluorescent layer (Japanese Patent Application Laid-open No. 207170/1994).

(6) An emitting layer comprising blue emitting coloring matter containing blue fluorescent coloring matter and green emitting coloring matter containing red fluorescent coloring matter and further green fluorescent coloring matter (Japanese Patent Application Laid-open No. 142169/1995).

Among these, the emitting layer (5) is preferably used.

In addition, an example of a red fluorescent material providing red emitting light is:

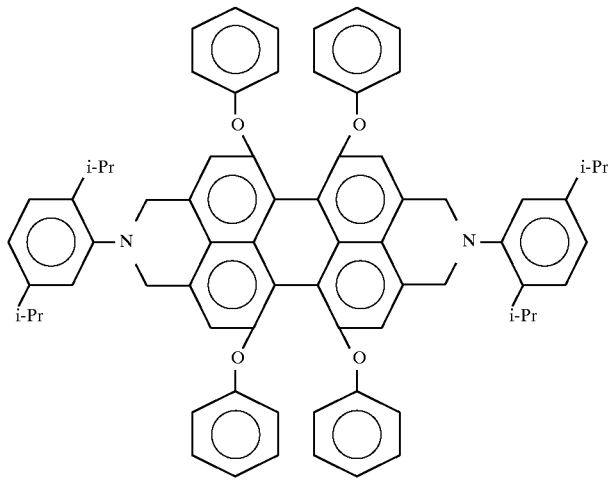

Lumogen F Red

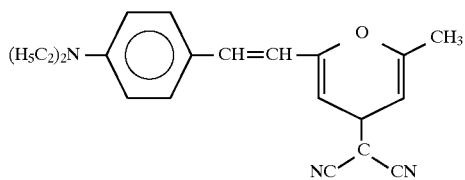

Dicyanomethylene pyran

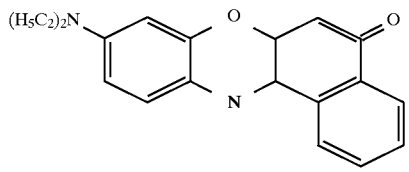

Phenoxazon

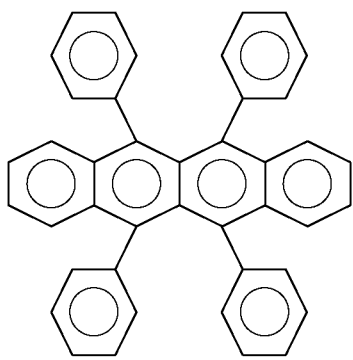

Rubrene

As the methods for forming an emitting layer using the above materials, known methods, for example, a vapor deposition method, a spin coating method, a LB method, or the like can be applied. A preferred emitting layer is especially a molecularly sedimentary film. The molecularly sedimentary film is a film formed by deposition of a subject compound in a vapor phase or a film formed by solidifying a subject compound in a solution or in a liquid phase. The molecularly sedimentary film is generally distinguished from a thin film (molecularly cumulative film) formed in the LB method by differences in a coagulating structure and a high-order structure, or by a functional difference caused by those structures.

Also, the emitting layer can be formed in a similar manner by a method disclosed in Japanese Patent Application Laid-open No. 51781/1982 in which a binding agent such as a resin and a subject compound are dissolved in a solvent to make a solution and then a thin film is made from the solution using a spin coating method or the like.

The thickness of the emitting layer is preferably in a range from 5 nm to 5 $\mu$m, though there are no limitations to the thickness of the emitting layer produced in such a manner and the thickness of the emitting layer is optionally selected.

The emitting layer of the organic EL elements has also the following functions.

(1) Injection functions which allow positive holes to be injected from an anode or a positive hole injecting layer in the presence of an electric field and allow electrons to be injected from a cathode or an electron injecting layer.
(2) Transferring functions which allow the injected charges (electrons and positive holes) to be transferred by electric field force.
(3) Emitting functions which allows electrons and positive holes to be combined to emit light.

Incidentally, there may be a difference in ease between the injecting of electrons and the injecting of positive holes. Also, there may be a difference between the transferability of positive holes and that of electrons in terms of mobility. However, it is desirable to transfer either positive holes or electrons.

(5)-3 Positive hole injecting layer

It is unnecessary to provide the positive hole injecting layer for the elements used in the present invention. However, it is preferable to utilize the positive hole injecting layer to improve emitting characteristics. This positive hole injecting layer is a layer for promoting to inject positive holes into an emitting layer, ensuring a high mobility of positive holes and small ionization energy of an order of less than 5.5 eV in general. As such a positive hole injecting layer, materials capable of transferring positive holes to the emitting layer in the presence of a lower electric field are preferable. It is more preferable that the mobility of positive hole be, for example, at least $10^{-6}$ cm$^2$/V.second in the presence of an electric field ranging from $10^4$ to $10^6$ V/cm.

There are no limitations to materials used for the positive hole injecting layer if these materials have the above preferable characteristics. Any material optionally selected from photo-conductive materials conventionally used as a material for transferring a charge of positive holes and from known materials used for a positive hole injecting layer of EL elements can be used.

Given as examples of these conventional materials are triazole derivatives (see the specification of U.S. Pat. No. 3,112,197, etc.), oxadiazole derivatives (see the specification of U.S. Pat. No. 3,189,447, etc.), imidazole derivatives (Japanese Patent Publication No. 16096/1962, etc.), polyarylalkane derivatives (see the specifications of U.S. Pat. No. 3,615,402, U.S. Pat. No. 3,820,989, U.S. Pat. No. 3,542,544, Japanese Patent Publications No. 555/1970 and No. 10983/1976, and Japanese patent Applications laid-open No. 93224/1976, No. 17105/1980, No. 4148/1981, No. 108667/1980, No. 156953/1980, and No. 36656/1981, etc.), pyrazoline derivatives and pyrazolone derivatives (see the specifications of U.S. Pat. No. 3,180,729, U.S. Pat. No. 4,278,746, and Japanese Patent Applications Laid-open No. 88064/1980, No. 88065/1980, No. 105537/1974, No. 51086/1980, No. 80051/1981, No. 88141/1981, No. 45545/1982, No. 112637/1979, and No. 74546/1980, etc.), phenylenediamine derivatives (see the specifications of U.S. Pat. No. 3,615,404, Japanese Patent Publications No. 10105/1981, No. 3712/1976, and No. 25336/1977, Japanese Patent Applications Laid-open No. 53435/1984, No. 110536/1984, and No. 119925/1984, etc.), arylamine derivatives (see the specifications of U.S. Pat. No. 3,567,450, U.S. Pat. No. 3,180, 703, U.S. Pat. No. 3,240,597, U.S. Pat. No. 3,658,520, U.S. Pat. No. 4,232,103, U.S. Pat. No. 4,175,961, U.S. Pat. No. 4,012,376, Japanese Patent Publications No. 35702/1974 and No. 27577/1964, Japanese Patent Applications Laid-open No. 144250/1980, No. 119132/1981, and No. 22437/1981, and DRP No. 1,110,518, etc.), amino substituted chalcone derivatives (see the specification of U.S. Pat. No. 3,526,501, etc.), oxazole derivatives (see the specification of U.S. Pat. No. 3,257,203, etc.), styrylanthracene derivatives (see the specification of Japanese Patent Application Laid-open No. 46234/1981, etc.), fluorenone derivatives (see the specification of Japanese Patent Application Laid-open No. 110837/1979 and etc.), hydrazone derivatives (see the specifications of U.S. Pat. No. 3,717,462, Japanese Patent Applications Laid-open No. 59143/1979, No. 52063/1980, No. 52064/1980, No. 46760/1980, No. 85495/1980, No. 11350/1982, No. 148749/1982, and No. 311591/1990, etc.), stilbene derivatives (see the specifications of Japanese Patent Applications Laid-open No. 210363/1986, No. 228451/1986, No. 14642/1986, No. 72255/1986, No. 47646/1987, No. 36674/1987, No. 10652/1987, No. 30255/1987, No. 93445/1985, No. 94462/1985, No. 174749/1985, and No. 175052/1985, etc.), silazane derivatives (see the specification of U.S. Pat. No. 4,950,950, etc.), polysilane type (see the specification of Japanese Patent Application Laid-open No. 204996/1990, etc.), aniline type copolymers (see the specification of Japanese Patent Application Laid-open No. 282263/1990, etc.), and electroconductive macromolecular oligomers (especially a thiophene oligomer) disclosed in Japanese Patent Application Laid-open No. 211399/1989.

As the materials used for the positive hole injecting layer, the above compounds can be used. Among these, polphyrin compounds (disclosed in Japanese Patent Application Laid-open No. 2956965/1988) and aromatic tertiary amines and styrylamine compounds (see the specifications U.S. Pat. No. 4,127,412, Japanese Patent Applications Laid-open No. 27033/1978, No. 58445/1979, No. 149634/1979, No. 64299/1979, No. 79450/1980, No. 144250/1980, No. 119132/1981, No. 295558/1986, No. 98353/1986, and No. 295695/1988, etc.) are preferable. It is especially preferable to use the aromatic tertiary amines.

Also, included as examples of the materials used for the positive hole injecting layer are compounds having two condensed aromatic rings in a molecule, for example, 4,4'-bis(N-(1-naphthyl)-N-phenylamino)biphenyl (hereinafter abbreviated as (NPD)) disclosed in U.S. Pat. No. 5,061,569 and also compounds in which three triphenylamine units are combined in a star-burst shape, for example, 4,4',4"-tris(N-(3-methylphenyl)-N-phenylamino)-triphenylamine (hereinafter abbreviated as (MTDATA)) disclosed in Japanese Patent Application Laid-open No. 308688/1992.

Also, other than the above-mentioned aromatic dimethylidine compounds shown as the material for the emitting layer, inorganic compounds such as p type Si and p type SiC can be utilized as the material used for the positive hole injecting layer.

The positive hole injecting layer can be produced by forming a thin film of the above-mentioned compound using a conventional method such as a vacuum deposition method, spin coating method casting method, LB method, or the like. There are no restrictions to the thickness of the positive hole injecting layer. However, the thickness of the positive hole injecting layer is generally from 5 nm to 5 μm. This positive hole injecting layer may be structured of one layer made from one or more of the above materials or may be a layer in which other positive hole injecting layers made from compounds differing from the compound of that layer are laminated on that layer.

The organic semiconductor layer has a function of promoting positive hole injection or electron injection into the emitting layer. It is desirable that the organic semiconductor may have an electro-conductivity of more than $10^{-10}$ S/cm. As materials used for such an organic semiconductor layer, electro-conductive oligomers such as thiophene containing oligomers and arylamine containing oligomers and electro-conductive dendrimers such as arylamine containing dendorimers can be used.

(5)-4 Electron injecting layer

The electron injecting layer is a layer promoting electron injection into the emitting layer. Among the electron injecting layers, the stick improving layer is one composed of a material readily adhering to a cathode. Preferred examples of materials used for the electron injecting layer are 8-hydroxyquinoline or metal complexes of its derivatives, or oxadiazole derivatives. As materials used for the stick improving layer, 8-hydroxyquinoline or metal complexes of its derivatives are especially preferable.

As specific examples of 8-hydroxyquinoline or metal complexes of its derivatives, metal chelate oxinoid compounds containing a chelate of oxine (8-quinolinole or 8-hydroxyquinoline in general) (for example, Alq.) can be given.

wherein $Ar^{10}$–$Ar^{13}$ respectively represent a substituted or non-substituted aryl group, $Ar^{10}$ and $Ar^{11}$ may be the same or different, $Ar^{12}$ and $Ar^{13}$ may be the same or different, and $Ar^{14}$ represents a substituted or non-substituted arylene group. Here, as examples of the aryl group, a phenyl group, biphenyl group, anthranyl group, perylenyl group, and pyrenyl group are given. As examples of the arylene group, a phenylene group, naphthylene group, biphenylene group, anthracenylene group, pennilenilene group, and pyrenylene group are given. Given as examples of the substituted group are an alkyl group having from 1 to 10 carbon atoms, an alkoxy group having from 1 to 10 carbon atoms, and a cyano group. These electron transferring compounds are preferably those capable of forming a thin film.

As specific examples of the above electron transferring compounds, the compounds represented by the following formula are given.

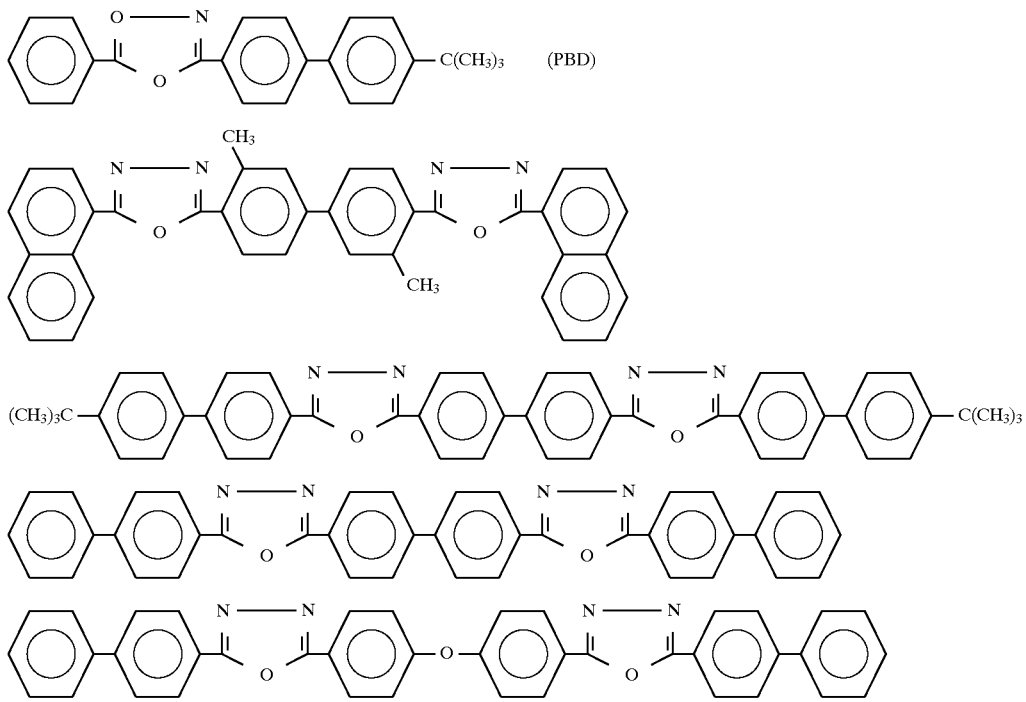

On the other hand, as typical examples of the oxadiazole derivatives, the electron transferring compounds represented by the following formulae (II), (III), and (IV) are given.

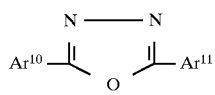 (II)

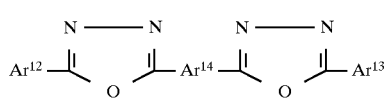 (III)

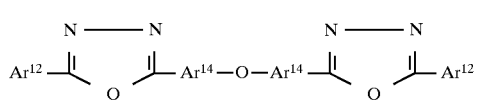 (IV)

(5)-5 Cathode

As examples of the cathode, those using, as an electrode material, metals, alloys, electroconductive compounds, and mixtures of these which have a low work function (less than 4 eV) are used. Given as examples of such an electrode material are metals such as sodium, sodium/potassium alloys, magnesium, lithium, magnesium/silver alloys, aluminum/aluminum oxide ($Al_2O_3$), aluminum/lithium alloys, indium, and rare earth metal.

A thin film of each these electrode materials is formed by means of vapor deposition, sputtering, or the like to produce the cathode.

The sheet resistance of the cathode is preferably less than several hundreds $\Omega/\square$. The thickness of the cathode is usually from 10 nm to 1 µm, preferably from 50 nm to 200 nm. Incidentally, for the EL elements used in the present invention, it is desirable that either the anode or the cathode be transparent or translucent to ensure high efficiency when irradiated with emitting light because the emitting light passes through the anode and the cathode.

(5)-6 Manufacture of organic EL elements

Using the above exemplified materials and methods, an anode, emitting layer, positive hole injecting layer as required, and electron injecting layer as required are formed and further a cathode is formed in that order to manufacture organic EL elements. Also, organic EL elements can be manufactured in the reverse order, specifically, by forming first a cathode and finally an anode.

A manufacturing example of organic EL elements having a structure in which an anode, a positive hole injecting layer, an emitting layer, an electron injecting layer, and a cathode are provided in that order on a support substrate is illustrated below.

First, a thin film of a thickness of less than 1 $\mu$m, preferably from 10 to 200 nm is formed of a material for an anode by vapor deposition, sputtering, or like to form an anode. Next, a positive hole injecting layer is formed on the anode. Formation of the positive hole injecting layer can be carried out, as mentioned above, by means of vacuum deposition, spin coating, casting, and LB. Among these means, vacuum deposition is preferable to form a homogeneous film with ease and to prevent occurrence of pin holes. When forming the positive hole injecting layer by means of vacuum deposition, the depositing conditions differ depending on the sort of compound (material for the positive hole injecting layer) to be used, the crystalline structure and the recombination structure of the object positive hole injecting layer, and the like. However, it is generally preferable to appropriately select the depositing conditions from a depositing source temperature ranging from 50° to 450° C., a vacuum ranging from $10^{-7}$ to $10^{-3}$ torr, a depositing speed ranging from 0.01 to 50 nm/sec, a substrate temperature ranging from −50° to 300° C., and a film thickness ranging from 5 nm to 5 $\mu$m.

Next, an emitting layer is formed on the positive hole injecting layer using a desired organic emitting material. Formation of the emitting layer can be carried out by Providing a thin film of the organic emitting material by means of vacuum deposition, sputtering, spin coating, and casting. Among these means, vacuum deposition is preferable to form a homogeneous film with ease and to prevent occurrence of pin holes. When forming the emitting layer by means of vacuum deposition, the depositing conditions differ depending on the sort of compound to be used. Generally, the depositing conditions can be selected from almost the same conditioning ranges as those in the formation of the positive hole injecting layer.

Next, an electron injecting layer is formed on the emitting layer. It is preferable to form the electron injecting layer by vacuum deposition to produce a homogeneous film in the same way as in the formation of the positive hole injecting layer or the emitting layer. The depositing conditions can be selected from almost the same conditioning ranges as those in the formation of the positive hole injecting layer or the emitting layer.

Finally, a cathode is laminated on the electron injecting layer to produce an organic EL element.

The cathode is formed of a metal so that vapor deposition or sputtering can be used. However, vacuum deposition is preferably used to protect the backing organic material from damages in forming a film.

When the organic EL elements are produced in the above-mentioned processes, it is preferable that the steps from the step of forming the anode to the step of forming the cathode are thoroughly processed by one evacuating operation.

Incidentally, in a case where a d.c. voltage is applying to the organic EL elements, when applying 5–40 volts, allowing the anode and the cathode to be provided with the positive (+) polarity and the negative (−) polarity respectively, luminance can be detected. When both the anode and the cathode are inversely polarized, luminance is not detected. Further, if an a.c. voltage is applied, luminance can be detected only at the time when the anode and the cathode are respectively polarized to the (+) polarity and the (−) polarity. The wave form of the a.c. current to be applied is optional.

As systems for manufacturing the organic EL elements in which each element is separately disposed on the same flat and emit light, an X-Y dot matrix system and an active matrix system are exemplified. Specifically, the X-Y dot matrix system comprises crossing striped anodes and cathodes, applying a d.c. voltage to each electrode, and allowing the crossed portions to emit light. On the other hand, the active matrix system comprises forming either dotted anodes or cathodes and allying a d.c. voltage to specified dotted portions using a switching device such as a TFT (Thin Film Transistor) to emit light. The striped or dotted anode and cathode can be formed by etching or lifting off by means of photolithography or vapor deposition with masking.

EXAMPLES

The present invention will be explained in more detail by way of examples, which are not intended to be limiting of the present invention Example 1

An acrylate type photocurable resist (viscosity of 250 cps) in which 3% by weight (dry weight) of carbon black was dispersed was applied by spin-coating to a glass plate (Corning 7059) of 10 mm×100 mm×1.1 mm (thickness) used as a support substrate After baking at 80° C., the substrate was set on an exposure unit using a high pressure mercury-vapor lamp as a power supply. The substrate was exposed to light (wave length of 365 nm) at a dose of 900 mJ/cm$^2$ through a mask capable of transferring an image of a latticed shielding layer (see FIG. 11) in which a stripe pattern of 50 $\mu$m (d$_2$) lines and 250 $\mu$m gaps was crossed with a stripe pattern of 100 $\mu$m lines and 600 $\mu$m gaps at right angles. After developing the substrate in an 1% solution (by weight) of sodium carbonate at room temperature for two minutes, successive exposure was entirely carried out from the glass surface of the substrate at a dose of 3,000 mJ/cm$^2$, followed by baking at 200° C. to form the pattern of the shielding layer. The thickness of the shielding layer was 20 $\mu$m. Also, it was confirmed from an Scanning Electron Microscopy (SEM) that the sectional shape of the pattern was rectangular.

Also, the transmittance of the shielding layer which was measured using a spectrophotometer was less than 10% at wave lengths ranging from 400 nm to 700 nm. Also, the reflectance of the shielding layer was 5%.

Next, the substrate was set on a screen printing apparatus. Using a print capable of preparing a dotted pattern S$_2$ (see FIG. 12) of a stripe array of 250 $\mu$m×600 $\mu$m, an ink (viscosity of 8,000 cps) prepared by mixing and dispersing 2.8% by weight (dry weight) of copper phthalocyanine type pigment (c.I. Pigment Blue 15:6), 0.2% by weight (dry weight) of dioxazine type pigments (C.I. Pigment Violet 23), polyvinyl chloride (average molecular weight of 20,000) as a binder resin, and cyclohexanone as a solvent was applied to the pattern gaps of the shielding layer to be printed. The substrate was then baked at 80° C. to produce a pattern of blue color filter layers with a thickness of 20 µm. The refractive index of the color filter layer was 1.50 (589 nm).

Next, the print was shifted 300 µm in parallel in the direction across the stripe array of the pattern of the blue color filter layer at a right angle. Then, an ink (viscosity of 8,000 cps) prepared by dissolving coumarin 6 of a concentration of 0,03 mol/kg (dry weight) and polyvinyl chloride resin (average molecular weight of 20,000) as a binder resin in cyclohexanone as a solvent was applied to the other gaps of the pattern of the shielding layer to be printed. The substrate was then baked at 80° C. to produce the pattern of fluorescent layers A with a thickness of 20 µm. The refractive index of the fluorescent layer A was 1.52 (589 nm).

Next, the print was further shifted 300 µm in parallel in the direction across the stripe array of the pattern of the fluorescent layer A at a right angle. Then, an ink (viscosity of 8,000 cps) prepared by dissolving coumarin 6 of a concentration of 0.03 mol/kg (dry weight), a fluorescent pigment prepared by kneading 4% by weight of rhodamine 6G and 4% by weight of rhodamine B in a benzoguanamine resin, and polyvinyl chloride resin (average molecular weight of 20,000) as a binder resin in cyclohexanone as a solvent was applied to the other gaps of the pattern of the shielding layer to be printed. The substrate was then baked at 80° C. to produce the pattern of an emitting layer B with a thickness of 20 µm. The refractive index of the emitting layer B was 1.52 (589 nm)

By the above processes, a substrate ($T_1=T_2$) in which different color conversion layers and the shielding layers were separately disposed was manufactured.

Extremely small parts of the shielding layer and the color conversion layer were cut off to confirm the luminance and the chromaticity of an organic EL elements to be laminated in a successive stage.

Next, an acrylate type heat-curable resin (V259PA, manufactured by Nippon Steel Chemical Co., Ltd.) was applied by spin-coating as a transmittable medium on the substrate. The substrate was then baked at 80° C., further baked at 160° C., and then polished as required to allow the substrate surface to be flatted within a flatness of ±0.1 µm.

The refractive index of the transmittable medium was 1.50 (589 nm).

Also, the substrate which was heated to 160° C. was spattered with silicon oxide ($SiO_2$) under a vacuum of $10^{-6}$ torr to form another transmittable medium. The thickness of this transmittable medium was 0.5 µm.

The total film thickness of the above transmittable media was approximately 10 µm (corresponding to d1). Accordingly, in the relation between $d_1$ and $d_2$, the equation, $d_2>d_1$ was satisfied and in the relation between $n_1$ and $n_2$, the equation $|n_1-n_2|<0.4$ was satisfied.

Next, organic EL elements were produced.

First, the substrate was heated to 160° C. and a film of a transparent electrode (anode) of an ITO (indium tinoxide) with a thickness of 0.15 µm and a surface resistance of 20 Ω/□ was formed on the silicon oxide film under a vacuum of $10^{-6}$ torr by sputtering.

Next, a positive photoresist (HPR 204, manufactured by Fuji-Hunt Electronics Technology Co.) was applied by spin-coating to the ITO and then baked at 80° C. Then, the substrate was exposed to light in an exposure unit at a dose of 100 mJ/cm² through a mask capable of transferring an image of a striped ITO pattern (see FIG. 13) of 250 µm lines and 50 µm gaps after alignment of the mask with the pattern of the shielding layer.

Next, the resist was developed on the substrate in a 2.38% TMAH (tetramethylammonium hydroxide solution) followed by post-baking at 120° C. to form the resist pattern.

Next, the substrate was immersed in hydrogen bromide solution (concentration of 47% by weight) to etch exposed portions of ITO resist pattern. Then the resist was peeled from the substrate to obtain a striped ITO pattern of 250 µm lines and 50 µm gaps.

Next, this substrate was washed with IPA and further irradiated with UV light. Then, the substrate was secured to a substrate holder of a vapor deposition unit (manufactured by Ulvac Corporation). As materials for vapor deposition, MTDATA and NPD for a positive hole injecting layer, DPVBI for an emitting material, DPAVB for a dopant, and Alq for an electron injecting layer were placed on a resistance heating boat made of molybdenum, Ag as a second metal for a cathode was attached to a tungsten filament, and Mg as a cathode metal for injecting electrons was attached to the molybdenum boat.

After that, the pressure in a vacuum vessel was reduced to $5\times10^{-7}$ torr and then the above materials were sequentially laminated in the following order. A vacuum was maintained during the steps between a step of forming a positive hole injecting layer and a step of forming the cathode by one evacuating operation. First, a positive hole injecting layer was formed by depositing the MTDATA at a vapor deposition rate of 0.1–0.3 nm/s to a film thickness of 200 nm and also depositing an NPD at a vapor deposition rate of 0.1–0.3 nm/s to a film thickness of 20 nm. Next, an emitting layer was formed by depositing a DPVBi at a vapor deposition rate of 0.1–0.3 nm/s and also depositing a DPAVB at a vapor deposition rate of 0.05 nm/s simultaneously to a total film thickness of 40 nm (the proportion by weight of dopant to host material was from 1.2 to 1.6). Then, an electron injecting layer was formed by depositing a Alq. at a vapor deposition rate of 0.1–0.3 nm/s to a film thickness of 20 nm. A cathode was formed by depositing Mg and Ag simultaneously through a mask capable of transferring an image of a stripe pattern (see FIG. 14) of 600 µm lines and 100 µm gaps, which crosses a stripe pattern of the anode ITO at a right angle. Specifically, the cathode was produced by depositing Mg and Ag at depositing rates of 1.3–1.4 nm/s and 0.1 nm/s respectively to a total film thickness of 200 nm. Thus, organic EL elements were produced.

A multicolor luminescent device composed of the organic EL elements was manufactured in this manner (see FIGS. 2(b) and 3(b)). When a d.c. voltage of 8 V was applied between the anode and the cathode of the multicolor luminescent device, the crossed portions (dotted pattern of 250 µm×600 µm: $S_1$) of the anodes and cathodes emitted light. The luminance of the organic EL elements viewed from the portion cut off of the shielding layer and the color conversion layer was 100 cd/m². The CIE chromaticity coordinate (JIS Z 8701) was as follows: x=0.16, y=0.24 and light of a blue color was detected.

Also, the luminance of light viewed from the blue color filter was 42 cd/m² and the CIE chromaticity coordinate was as follows: x=0.14, y=0.12 and light of a blue color and high color purity was detected.

On the other hand, the luminance of light viewed from the fluorescent layer A was 120 cd/m² and the CIE chromaticity coordinate was as follows: x=0.28, y=0.62 and light of a yellowish green color was detected.

Further, the luminance of light viewed from the fluorescent layer B was 30 cd/m² and the CIE chromaticity coordinate was as follows: x=0.60, y=0.31 and light of a red color was detected.

Incidentally, the emitting area $S_1$ of the organic EL element was the same as the area $S_2$ of the color conversion layer ($S_1=S_2$).

In the organic EL multicolor luminescent device manufactured in the above manner, a fundamental emitting color could be obtained from each color conversion layer, and the angle of view (see FIG. 4) to the extent that color alteration (color mixing) did not occur was ±80 degrees which was an allowable level in actual use.

Example 2

An organic EL multicolor luminescent device (see FIG. 5(d)) was manufactured in the same manner as in Example 1 except that when forming the color conversion layer in Example 1, specifically, the blue color filter, the fluorescent layer A, and the fluorescent layer B, the viscosity of each of the inks used in these layers was decreased to 6500 cps by increasing the solvent content (decreasing the solid concentration) and each film thickness was reduced to 15 μm ($d_2>d_1$, $T_1$ (20 μm)>$T_2$ (15 μm), $S_1=S_2$).

In this multicolor luminescent device, a fundamental emitting color could be obtained from each color conversion layer, and the angle of view to the extent that color alteration (color mixing) did not occur was ±80 degrees which was an allowable level in actual use.

Example 3

Figure 6C:
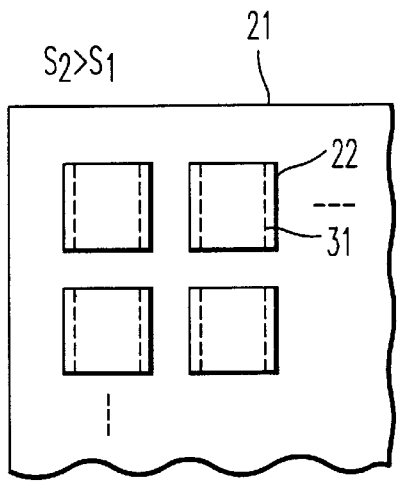

An organic EL multicolor luminescent device (see FIG. 6(c)) was manufactured in the same manner as in Example 1 except that the pattern of the transparent electrode (anode) of the organic EL elements in Example 1 was altered to a striped ITO pattern of 200 μm lines and 100 μm gaps ($d_2>d_1$, $T_1=T_2$).

The emitting area $S_1$ formed a dotted pattern of 200 μm×600 μm so that the equation $s_1<S_2$ was satisfied since the areas of the color conversion layers were each formed of a dotted pattern of 250 μm×600 μm.

In this multicolor luminescent device, a fundamental emitting color could be obtained from each color conversion layer. The angle of view to the extent that color alteration (color mixing) did not occur was ±85 degrees which was larger than those in Examples 1 and 2.

Example 4

As a support substrate, a glass (barium borosilicate glass) of 100 mm×100 mm×0.05 mm (thickness), on which was formed a film with a transparent electrode (anode) of ITO (indium-tin oxide) with a surface resistance of 20 Ω/□ and a thickness of 0.15 μm, was prepared. The refractive index of the substrate was 1.52 (588 nm) and the substrate was a transmittable medium.

Next, on the opposite side of the film surface of the ITO, a shielding layer and color conversion layers were separately disposed on the same flat to produce a substrate in the same manner as in Example 1.

Also, patterning of the ITO was carried out in the same manner as in Example 1.

Here, the thickness of a transmittable medium formed on a shielding layer was 50 μm ($d_1$) and $d_1=d_2$. Also, $|n_1-n_2|<0.4$.

After that, organic EL elements were manufactured under the same conditions as in Example 1 and an organic EL multicolor luminescent device was manufactured (see FIGS. 2(a) and 3(b)).

The emitting area $S_1$ of the organic EL element was the same as the area $S_2$ of each color conversion layer ($S_1=S_2$).

In this multicolor luminescent device, a fundamental emitting color could be obtained from each color conversion layer. The angle of view to the extent that color alteration (color mixing) did not occur was ±45 degrees which was an allowable level in actual use.

Example 5

An acrylate type photocurable resist (viscosity of 10 cps) in which 30% by weight (dry weight) of carbon black was dispersed was applied by spin-coating on a glass plate (Corning 7059) of 100 mm×100 mm×1.1 mm (thickness) used as a support substrate. The substrate was baked at 80° C. and further at 200° C. to form a black contact film of a thickness of 2 μm.

Next, the opposite side of the black contact film was washed with IPA and further irradiated with UV light. Then, the substrate was secured to a substrate holder of a vapor deposition unit (manufactured by Ulvac Corporation). As materials for vapor deposition, MTDATA and NPD for a positive hole injecting layer, DPVBi for an emitting material, DPAVB for a dopant, and Alq for an electron injecting layer were placed on a resistance heating boat made of molybdenum, Ag as a second metal for a cathode was attached to a tungsten filament, and Mg as a cathode metal for injecting electrons was attached to the molybdenum boat.

After that, the pressure in a vacuum vessel was reduced to $5\times10^{-7}$ torr and then a pattern of a cathode film was formed through a mask capable of transferring an image of a striped pattern (see FIG. 14) of 600 μm lines and 100 μm gaps. Then, layers from an electron injecting layer to a positive injecting layer were laminated on the substrate. When these layers were sequentially laminated, a vacuum was maintained by one evacuating operation.

First, Mg and Ag were simultaneously deposited as the cathode at depositing rates of 1.3–1.4 nm/s and 0.1 nm/s respectively to a total film thickness of 200 nm.

Next, an electron injecting layer was formed by depositing Alq at a vapor deposition rate of 0.1–0.3 nm/s to a film thickness of 20 nm. Then, an emitting layer was formed by depositing DPVBi at a vapor deposition rate of 0.1–0.3 nm/s and also depositing DPAVB at a vapor deposition rate of 0.05 nm/s to a total film thickness of 40 nm (the proportion by weight of dopant to host material was from 1.2 to 1.6). After that, a positive hole injecting layer was formed by depositing NPD at a deposition rate of 0.1–0.3 nm/s to a film thickness of 20 nm and MTDATA at a seposition rate of 0.1–0.3 nm/s to a film thickness of 400 nm.

Next, the substrate was transferred to a sputtering unit where a film of an ITO of a thickness of 120 nm and a resistance of 20 Ω/□ was formed on the substrate as a transparent electrode (anode) through a mask capable of transferring an image of a striped pattern (see FIG. 13) of 250 μm lines and 50 μm gaps to produce an organic EL elements. Here, the mask was so arranged that the array of anodes and the array of cathodes crossed at right angles, thereby allowing each terminal of the anodes and cathodes to be prepared.

Next, an epoxy type photocurable adhesive (3113, manufactured by Three Bond Corp.) was applied to the peripheries of the crossed portions at a width of 1 mm approximately with partial slits using a dispenser.

On the other hand, a substrate, on which a shielding layer and different color conversion layers were each separately disposed on the same flat was prepared in the same manner as in Example 1. This substrate and the above organic EL elements on which the adhesive had been applied were bound so that the organic EL elements faced the shielding layer and the color conversion layers. Then, only the portions on which the adhesive was applied were irradiated with UV light to cure the adhesive at those portions.

Next, hydrocarbon fluoride (trade mark: FC 70, manufactured by 3M Corp. in U.S.A) was injected under a nitrogen atmosphere using an injection needle from the above slits formed in the cured adhesive as a transmittable layer.

Then, the same adhesive was filled into the slits in the cured adhesive and photo-cured by irradiating with UV light in the same way as above. The refractive index of the hydrocarbon fluoride was 1.30 (589 nm). Also, the distance ($d_1$) between the organic EL elements and the shielding layer was 10 μm and the equation, $d_2 > d_1$ was satisfied. In addition, the equation, $|n_1 - n_2| < 0.4$ was satisfied.

A multicolor luminescent device composed of the organic EL elements was manufactured in this manner (see FIGS. 2(c) and 3(b)). When a d.c. voltage of 8 V was applied between the anode and the cathode of the multicolor luminescent device, the crossed portions (dotted pattern of 250 μm×600 μm: $S_1$) of the anodes and cathodes emitted light. The luminance of the organic EL elements viewed from the portion cut off of the shielding layer and the color conversion layer was 100 cd/m². The CIE chromaticity coordinate (JIS Z 8701) was as follows: x=0.16, y=0.24 and light of a blue color was detected.

Also, the luminance of light viewed from the blue color filter was 40 cd/m² and the CIE chromaticity coordinate was as follows: x=0.14, y=0.12 and light of a blue color was detected.

On the other hand, the luminance of light viewed from the fluorescent layer A was 110 cd/m² and the CIE chromaticity coordinate was as follows: x=028, y=0.62 and light of a yellowish green color was detected.

Further, the luminance of light viewed from the fluorescent layer B was 28 cd/m² and the CIE chromaticity coordinate was as follows; x=0.60, y=0.31 and light of a red color was detected.

Incidentally, the emitting area $S_1$ of the organic EL element was the same as the area $S_2$ of the color conversion layer ($S_1 = S_2$).

In the organic EL multicolor luminescent device manufactured in the above manner, a fundamental emitting color could be obtained from each color conversion layer. The angle of view to the extent that color alteration (color mixing) did not occur was ±80 degrees which was an allowable level in actual use.

Example 6

An acrylate type photocurable resist (viscosity of 10 cps) in which 30% by weight (dry weight) of carbon black was dispersed was applied by spin-coating to a glass plate (Corning 7059) of 100 mm×100 mm×1.1 mm (thickness) used as a support substrate. After baking at 80° C., the substrate was exposed at a dose of 300 mJ/cm² (365 nm) using an exposure unit provided with a high pressure mercury-vapor lamp as a power supply through a mask capable of transferring an image of the pattern of a shielding layer shown in FIG. 11.

The substrate was developed in a 1% solution (by weight) of sodium carbonate at room temperature for two minutes and then the substrate was baked at 200° C. to form the pattern of the shielding layer. The thickness of the shielding layer was 2 μm. Also, it was confirmed from SEM that the sectional shape of the pattern was rectangular.

Also, the transmittance of the shielding layer which was measured using a spectrophotometer was less than 10% at wave lengths ranging from 400 nm to 700 nm. Also, the reflectance of the shielding layer was 5%.

Next, the substrate was spin-coated with an acrylate type photocurable resist (viscosity of 10 cps) in which 28% by weight (dry weight) of a copper phthalocyanine type pigment (C.I. pigment blue 15:6) and 2% by weight (dry weight) of a dioxazine type pigment (C.I. pigment violet 23) were dispersed. After baking at 80° C., the substrate was exposed at a dose of 300 mJ/cm² (355 nm) using an exposure unit provided with a high pressure mercury-vapor lamp as a power supply through a mask capable of transferring an image of the pattern ($S_2$) of the color conversion layer shown in FIG. 12, aligning with the pattern of the shielding layer.

The substrate was developed in a 1% solution (by weight) of sodium carbonate at room temperature for two minutes and then the substrate was baked at 200° C. to form the pattern of a blue color filter. The thickness of the blue color filter was 2 μm. Also, the refractive index of the blue color filter was 1.50 (589 nm).

Next, the substrate was spin-coated with an acrylate type photocurable resist (viscosity of 10 cps) in which 23% by weight (dry weight) of a halogenated copper phthalocyanine type pigment (C.I. pigment green 36) and 7% by weight of an azo type pigment (C.I. pigment yellow 83) were dispersed. After baking at 80° C., the substrate was exposed at a dose of 300 mJ/cm² (365 nm) using an exposure unit provided with a high pressure mercury-vapor lamp as a power supply through a mask capable of transferring an image of the pattern of the color conversion layer shown in FIG. 12, after shifting the substrate 300 μm in parallel in the direction across the stripe array of the pattern of the blue color filter at a right angle and aligning with the mask. Then, the substrate was developed in a 1% solution (by weight) of sodium carbonate at room temperature for two minutes and then the substrate was baked at 200 ° C. to form the pattern of a green color filter. The thickness of the green color filter was 2 μm. Also, the refractive index of the green color filter was 1.50 (589 nm).

Next, the substrate was spin-coated with an acrylate type photocurable resist (viscosity of 10 cps) in which 24% by weight (dry weight) of an anthraquinone type pigment (C.I. pigment red 177) and 6% by weight (dry weight) of an azo type pigment (C.I. pigment yellow 6) were dispersed. After baking at 80° C., the substrate was exposed at a dose of 300 mJ/cm² (365 nm) using an exposure unit provided with a high pressure mercury-vapor lamp as a power supply through a mask capable of transferring an image of the pattern of the color conversion layer shown in FIG. 12, after shifting the substrate 300 μm in parallel in the direction across the stripe array of the pattern of the green color filter at a right angle and aligning with the mask. Then, the substrate was developed in a 1% solution (by weight) of sodium carbonate at room temperature for two minutes and the substrate was baked at 200° C. to form the pattern of a red color filter. The thickness of the red color filter was 2 μm. Also, the refractive index of the red color filter was 1.50 (589 nm).

By the above processes, a substrate ($T_1 = T_2$) in which a color conversion layer differing from the shielding layer was separately disposed, was manufactured.

Incidentally, extremely small parts of the color conversion layer were cut off to confirm the luminance and the chromaticity of organic EL elements to be laminated in a successive stage.

A transmittable layer and a transparent electrode (anode, ITO pattern: FIG. 13) of the organic EL elements were formed under the same conditions as in Example 1 ($d_2 > d_1$).

Next, this substrate was washed with IPA and further irradiated with UV light. Then, the substrate was secured to a substrate holder of a vapor deposition unit (manufactured by Ulvac Corporation). As materials for vapor deposition, MTDATA and NPD for a positive hole injecting layer, DPVBi, PAVBi, and rubrene for an emitting material, and Alq for an electron injecting layer were placed on a resistance heating boat made of molybdenum, Ag as a second metal for a cathode was attached to a tungsten filament, and Mg as a cathode metal for injecting electrons was attached to the molybdenum boat.

After that, the pressure in a vacuum vessel was reduced to $5 \times 10^{-7}$ torr and then the above materials were sequentially laminated in the following order. A vacuum was maintained during the steps between a step of forming a positive hole injecting layer and a step of forming the cathode by one evacuating operation. A cathode was formed through a mask capable of transferring an image of a stripe pattern (see FIG. 14) of 600 μm lines and 100 μm gaps, which crosses a stripe pattern of the transparent electrode (anode) of ITO at a right angle.

First, a positive hole injecting layer was formed by depositing the MTDATA at a vapor deposition rate of 0.1–0.3 nm/s to a film thickness of 200 nm and also depositing NPD at a vapor deposition rate of 0.1–0.3 nm/s to a film thickness of 20 nm.

Next, an emitting layer was formed by depositing DPVBi at a vapor deposition rate of 0.1–0.3 nm/s to a film thickness of 50 nm and also depositing PAVBi as a first emitting layer inside the film at a vapor deposition rate of 0.003–0.09 nm/s at the same time.

Then, an electron injecting layer was formed by depositing Alq at a vapor deposition rate of 0.1–0.3 nm/s to a film thickness of 20 nm/s and also depositing rubrene as a second emitting layer inside the film at a vapor deposition rate of 0.0005–0.0015 nm/s at the same time.

Finally, a cathode was formed by depositing Mg and Ag simultaneously at deposition rates of 1.3–1.4 nm/s and 0.1 nm/s respectively to a total film thickness of 200 nm. Thus, organic EL elements were produced.

A multicolor luminescent device composed of the organic EL elements was manufactured in this manner (see FIGS. 2(b) and 3(b)). When a d.c. voltage of 9 V was applied between the anode and the cathode of the multicolor luminescent device, the crossed portions (dotted pattern of 250 μm×600 μm: $S_1$) of the transparent electrode (anode) and cathode emitted light. The luminance of the organic EL elements viewed from the portion cut off of the shielding layer and the color conversion layer was 100 cd/m². The CIE chromaticity coordinate was as follows: x=0.25, y=0.28 and light of a white color was detected.

Also, the luminance of the light viewed from the blue color filter was 10 cd/m² and the CIE chromaticity coordinate was as follows: x=0.10, y=0.15 and light of a blue color was detected.

On the other hand, the luminance of the light viewed from the green color filter was 45 cd/m² and the CIE chromaticity coordinate was as follows: x=0.28, y=0.62 and light of a yellowish green color was detected.

Further, the luminance of the light viewed from the red color filter was 15 cd/m² and the CIE chromaticity coordinate was as follows: x=0.60, y=0.31 and light of a red color was detected.

Incidentally, the emitting area $S_1$ of the organic EL element was the same as the area $S_2$ of the color conversion layer $S_2$ ($S_1 = S_2$).

In the organic EL multicolor luminescent device manufactured in the above manner, a fundamental emitting color could be obtained from each color conversion layer. The angle of view, to the extent that color alteration (color mixing) did not occur, was ±80 degrees which was an allowable level in actual use.

Examples 7–10

Each organic EL multicolor luminescent device was manufactured in the same manner as in Example 1 except that the relations between $d_2$ and $d_1$, $T_1$ and $T_2$, and $S_1$ and $S_2$ were variously changed.

The results are shown in Table 4 (including the results of Examples 1–6).

In these multicolor luminescent devices manufactured in the above manner, a fundamental emitting color could be obtained from each color conversion layer. The angle of view, to the extent that color alteration (color mixing) did not occur, was more than ±45 degrees which was an allowable level in actual use.

TABLE 4

| | $d_1$ (μm) | $d_2$ (μm) | $d_1$ versus $d_2$ | $T_1$ (μm) | $T_2$ (μm) | $T_1$ versus $T_2$ | $S_1$ (μm) | $S_2$ (μm) | $S_1$ versus $S_2$ | Angle of view |
|---|---|---|---|---|---|---|---|---|---|---|
| Example 1 | 10 | 50 | $d_1 < d_2$ | 20 | 20 | $T_1 = T_2$ | 250 × 600 | 250 × 600 | $S_1 = S_2$ | ±80 |
| Example 2 | 10 | 50 | $d_1 < d_2$ | 20 | 15 | $T_1 > T_2$ | 250 × 600 | 250 × 600 | $S_1 = S_2$ | ±80 |
| Example 3 | 10 | 50 | $d_1 < d_2$ | 20 | 20 | $T_1 = T_2$ | 200 × 600 | 250 × 600 | $S_1 < S_2$ | ±85 |
| Example 4 | 50 | 50 | $d_1 = d_2$ | 20 | 20 | $T_1 = T_2$ | 250 × 600 | 250 × 600 | $S_1 = S_2$ | ±45 |
| Example 5 | 10 | 50 | $d_1 < d_2$ | 20 | 20 | $T_1 = T_2$ | 250 × 600 | 250 × 600 | $S_1 = S_2$ | ±80 |
| Example 6 | 10 | 50 | $d_1 < d_2$ | 2 | 2 | $T_1 = T_2$ | 250 × 600 | 250 × 600 | $S_1 = S_2$ | ±80 |
| Example 7 | 10 | 50 | $d_1 < d_2$ | 20 | 15 | $T_1 > T_2$ | 200 × 600 | 250 × 600 | $S_1 < S_2$ | ±85 |
| Example 8 | 50 | 50 | $d_1 = d_2$ | 20 | 15 | $T_1 > T_2$ | 200 × 600 | 250 × 600 | $S_1 < S_2$ | ±60 |
| Example 9 | 50 | 50 | $d_1 = d_2$ | 20 | 15 | $T_1 > T_2$ | 250 × 600 | 250 × 600 | $S_1 = S_2$ | ±45 |
| Example 10 | 50 | 50 | $d_1 = d_2$ | 20 | 20 | $T_1 = T_2$ | 200 × 600 | 250 × 600 | $S_1 < S_2$ | ±60 |
| Comparative Example 1 | 100 | 50 | $d_1 > d_2$ | 20 | 20 | $T_1 = T_2$ | 250 × 600 | 250 × 600 | $S_1 = S_2$ | ±30 |
| Comparative Example 2 | 10 | 50 | $d_1 = d_2$ | 10 | 20 | $T_1 < T_2$ | 250 × 600 | 250 × 600 | $S_1 = S_2$ | ±40 |
| Comparative Example 3 | 10 | 50 | $d1 = d2$ | 20 | 20 | $T_1 = T_2$ | 290 × 600 | 250 × 600 | $S_1 > S_2$ | ±30 |

Example 11

A glass plate (Corning 7059) of 100 mm×100 mm×1.1 mm (thickness) used as a support substrate was spin-coated with an acrylate type photocurable resist (viscosity of 250 cps) in which 3% by weight (dry weight) of carbon black was dispersed. After baking at 80° C., the substrate was set on an exposure unit provided with a high pressure mercury-vapor lamp as a power supply. The substrate was exposed to light (wave length of 365 nm) at a dose of 750 mJ/cm$^2$ through a mask capable of transferring an image of the pattern of a shielding layer as shown FIG. 11.

After developing the substrate in an 1% solution (by weight) of sodium carbonate at room temperature for three minutes, successive exposure was carried out from the entire glass surface of the substrate at a dose of 3,000 mJ/cm$^2$ followed by baking at 200° C. to form the pattern of the shielding layer. The thickness of the shielding layer was 20 μm. Also, it was confirmed from SEM that the sectional shape of the pattern was inverse trapezoidal to show that the line width of the support substrate side (opposite side to the transmittable layer) was 30 μm (50 μm at the transmittable side).

Successively, a color conversion layer, a transmittable layer, and organic EL elements were formed in the same manner as in Example 1 to manufacture an organic EL multicolor luminescent device (see FIG. 9(*b*)).

In these multicolor luminescent devices manufactured in the above manner, a fundamental emitting color could be obtained from each color conversion layer. The angle of view, to the extent that color alteration (color mixing) did not occur, was more than ±80 degrees which was an allowable level in actual use. Also, the opening of the multicolor luminescent device became so wide that the entire range of brightness was increased, thereby promoting visibility.

Example 12

A shielding layer was prepared in the same conditions as in Example 1.

An entire substrate was spin-coated with polyvinyl alcohol solution (10 weight % concentration) After baking at 80° C., the sectional shape of the pattern was observed using SEM. As a result, it was confirmed that almost no polyvinyl alcohol film was formed on the side of the pattern of the shielding layer.

Next, while the substrate was rotated, aluminum was vapor-deposited at room temperature under a vacuum of 5×10$^{-7}$ torr obliquely to the substrate to aim at the side of the shielding layer. As a result, it was confirmed using an SEM that aluminum film was formed on the side of the pattern of the shielding layer. The reflectance of the aluminum film was more than 10% at wave lengths ranging from 400 nm to 700 nm.

The aluminum film adhering to unnecessary portions was lifted off together with the polyvinyl alcohol film by washing with water.

Next, a color conversion layer, a transmittable layer, and organic EL elements were formed in the same manner as in Example 1 to manufacture an organic EL multicolor luminescent device (see FIG. 10(*b*)).

When a d.c. voltage of 8 V was applied between the anode and the cathode of the multicolor luminescent device, the crossed portions of anodes and cathodes emitted light. The luminance of the organic EL elements viewed from the portion cut off of the shielding layer and the color conversion layer was 100 cd/m$^2$. The CIE chromaticity coordinate (JIS Z 8701) was as follows: x=0.16, y=0.24 and light of a blue color was detected.

Also, the luminance of the light viewed from the blue color filter was 46 cd/m$^2$ and the CIE chromaticity coordinate was as follows: x=0.14, y=0.12 and light of a blue color and a high color purity was detected.

On the other hand, the luminance of the light viewed from the fluorescent layer A was 130 cd/m$^2$ and the CIE chromaticity coordinate was as follows: x=0.28, y=0.62 and light of a yellowish green color was detected.

Further, the luminance of the light viewed from the fluorescent layer B was 33 cd/m$^2$ and the CIE chromaticity coordinate was as follows: x=0.60, y=0.31 and light of a red color was detected.

Accordingly, by forming a reflective layer such as a aluminum film on the side of the shielding layer, the luminance viewed from the color conversion layer was improved. Also, a fundamental emitting color could be obtained from each color conversion layer. The angle of view, to the extent that color alteration (color mixing) did not occur, was ±80 degrees which was an allowable level in actual use.

Example 13

A shielding layer was prepared under the same conditions as in Example 11.

A substrate was entirely spin-coated with polyvinyl alcohol solution (10 weight % concentration). After baking at 80° C., the sectional shape of the pattern was observed using SEM. As a result, it was confirmed that almost no polyvinyl alcohol film was detected at the inverse taper side of the pattern of the shielding layer.

Next, while the substrate was rotated, aluminum was vapor-deposited at room temperature under a vacuum of 5×10$^{-7}$ torr obliquely to the substrate to aim the inverse taper side of the shielding layer. As a result, it was confirmed from an SEM that a film of aluminum was formed on the inverse taper side of the shielding layer. The reflectance of the aluminum film was more than 10% at a wave length ranging from 400 nm to 700 nm.

The aluminum film adhering to unnecessary portions was lifted off together with the polyvinyl alcohol film by washing with water.

Next, a color conversion layer, a transmittable layer, and organic EL elements were formed in the same manner as in Example 1 to manufacture an organic EL multicolor luminescent device (see FIG. 10(*c*)).

When a d.c. voltage of 8 V was applied between the anode and the cathode of the multicolor luminescent device, the crossed portions of anodes and cathodes emitted light. The luminance of the organic EL elements viewed from the portion cut off of the shielding layer and the color conversion layer was 100 cd/m$^2$. The CIE chromaticity coordinate (JIS Z 8701) was as follows: x=0.16, y=0.24 and light of a blue color was detected.

Also, the luminance of the light viewed from the blue color filter was 50 cd/m$^2$ and the CIE chromaticity coordinate was as follows: x=0.14, y=0.12 and light of a blue color and of a high color purity was detected.

On the other hand, the luminance of the light viewed from the fluorescent layer A was 140 cd/m$^2$ and the CIE chromaticity coordinate was as follows: x=0.28, y=0.62 and light of a yellowish green color was detected.

Further, the luminance of the light viewed from the fluorescent layer B was 36 cd/m$^2$ and the CIE chromaticity coordinate was as follows: x=0.60, y=0.31 and light of a red color was detected.

Accordingly, by forming a reflective layer such as a aluminum film on the side of the shielding layer, the luminance viewed from the color conversion layer was improved. Also, a fundamental emitting color could be obtained from each color conversion layer. The angle of view, to the extent that color alteration (color mixing) did not occur, was ±80 degrees which was an allowable level in actual use. Also, the opening of the multicolor luminescent device became so wide that the entire range of brightness was increased, thereby promoting visibility.

Example 14

A shielding layer was prepared in the same manner as in Example 11 except that aluminum powder was used instead of carbon black.

The thickness of the shielding layer was 20 μm. It was confirmed from SEM that the sectional shape of the shielding layer was almost rectangular.

Also, the transmittance of the shielding layer which was measured using a spectrophotometer was less than 10% at wave lengths ranging from 400 nm to 700 nm. Also, the reflectance of the shielding layer was more than 10%.

Next, a color conversion layer, a transmittable layer, and organic EL elements were formed in the same manner as in Example 1 to manufacture an organic EL multicolor luminescent device (see FIG. 10(b)).

When a d.c. voltage of 8 V was applied between the anode and the cathode of the multicolor luminescent device, the crossed portions of anodes and cathodes emitted light. The luminance of the organic EL elements viewed from the portion cut off of the shielding layer and the color conversion layer was 100 cd/m$^2$. The CIE chromaticity coordinate (JIS Z 8701) was as follows: x=0.16, y=0.24 and light of a blue color was detected.

Also, the luminance of the light viewed from the blue color filter was 45 cd/m$^2$ and the CIE chromaticity coordinate was as follows: x=0.14, y=0.12 and light of a blue color was detected.

On the other hand, the luminance of the light viewed from the fluorescent layer A was 125 cd/m$^2$ and the CIE chromaticity coordinate was as follows: x=0.28, y=0.62 and light of a yellowish green color was detected.

Further, the luminance of the light viewed from the fluorescent layer B was 32 cd/m$^2$ and the CIE chromaticity coordinate was as follows: x=0.60, y=0.31 and light of a red color was detected.

Accordingly, since the reflectance at the side of the shielding layer was more than 10%, the luminance of the light viewed from the color conversion layer was improved. Also, fundamental emitting color could be obtained from each color conversion layer. The angle of view, to the extent that color alteration (color mixing) did not occur, was ±80 degrees which was an allowable level in actual use.

Example 15

A shielding layer was prepared in the same manner as in Example 11 except that aluminum powder was used instead of carbon black.

The thickness of the shielding layer was 20 μm. It was confirmed from SEM that the sectional shape of the shielding layer was inverse trapezoidal to show that the line width of the support substrate side (opposite side to the transmittable layer) was 30 μm (50 μm at the transmittable medium side).

Also, the transmittance of the shielding layer which was measured using a spectrophotometer was less than 10% at wave lengths ranging from 400 nm to 700 nm. Also, the reflectance of the shielding layer was more than 10%.

Next, a color conversion layer, a transmittable layer, and organic EL elements were formed in the same manner as in Example 1 to manufacture an organic EL multicolor luminescent device (see FIG. 10(c)).

When a d.c. voltage of 8 V was applied between the anode and the cathode of the multicolor luminescent device, the crossed portions of anodes and cathodes emitted light. The luminance of the organic EL elements viewed from the portion cut off of the shielding layer and the color conversion layer was 100 cd/m$^2$. The CIE chromaticity coordinate (JIS Z 8701) was as follows: x=0.16, y=0.24 and light of a blue color was detected.

Also, the luminance of the light viewed from the blue color filter was 49 cd/m$^2$ and the CIE chromaticity coordinate was as follows: x=0.14, y=0.12 and light of a blue color and a high color purity was detected.

On the other hand, the luminance of light viewed from the fluorescent layer A was 135 cd/m$^2$ and the CIE chromaticity coordinate was as follows: x=0.28, y=0.62 and light of a yellowish green color was detected.

Further, the luminance of the light viewed from the fluorescent layer B was 35 cd/m$^2$ and the CIE chromaticity coordinate was as follows: x=0.60, y=0.31 and light of a red color was detected.

Accordingly, by forming a reflective layer such as a aluminum film on the side of the shielding layer, the luminance viewed from the color conversion layer was improved. Also, a fundamental emitting color could be obtained from each color conversion layer. The angle of view, to the extent that color alteration (color mixing) did not occur, was ±80 degrees which was an allowable level in actual use. Also, the opening of the multicolor luminescent device became so wide that the entire range of brightness was increased, thereby promoting visibility.

Example 16

A shielding layer was prepared in the same manner as in Example 11 except that titanium oxide powder (TiO$_2$) was used instead of carbon black.

The thickness of the shielding layer was 20 μm. It was confirmed from SEM that the sectional shape of the shielding layer was inverse trapezoidal to show that the line width of the support substrate side (opposite side to the transmittable layer) was 30 μm (50 μm at the transmittable medium side).

Also, the transmittance of the shielding layer which was measured using a spectrophotometer was less than 10% at wave lengths ranging from 400 nm to 700 nm. Also, the reflectance of the shielding layer was more than 10%.

Next, a color conversion layer, a transmittable layer, and organic EL elements were formed in the same manner as in Example 1 to manufacture an organic EL multicolor luminescent device (see FIG. 10(c)).

When a d.c. voltage of 8 V was applied between the anode and the cathode of the multicolor luminescent device, the crossed portions of anodes and cathodes emitted light. The luminance of the organic EL elements viewed from the portion cut off of the shielding layer and the color conversion layer was 100 cd/m$^2$. The CIE chromaticity coordinate (JIS Z 8701) was as follows: x=0.16, y=0.24 and light of a blue color was detected.

Also, the luminance of the light viewed from the blue color filter was 48 cd/m² and the CIE chromaticity coordinate was as follows: x=0.14, y=0.12 and light of a blue color was detected.

On the other hand, the luminance of the light viewed from the fluorescent layer A was 133 cd/m² and the CIE chromaticity coordinate was as follows: x=0.28, y=0.62 and light of a yellowish green color was detected.

Further, the luminance of the light viewed from the fluorescent layer B was 35 cd/m² and the CIE chromaticity coordinate was as follows: x=0.60, y=0.31 and light of a red color was detected.

Accordingly, by forming a reflective layer such as a aluminum film on the side of the shielding layer, the luminance viewed from the color conversion layer was improved. Also, a fundamental emitting color could be obtained from each color conversion layer. The angle of view, to the extent that color alteration (color mixing) did not occur, was ±80 degrees which was an allowable level in actual use. Also, the opening of the multicolor luminescent device became so wide that the entire range of brightness was increased, thereby promoting visibility.

Comparative Examples 1–3

Each organic EL multicolor luminescent device was manufactured in the same manner as in Example 1 except that the relations between $d_2$ and $d_1$, $T_1$ and $T_2$, and $S_1$ and $S_2$ were altered as shown in Table 4.

Comparative Example 1 is shown in FIGS. 2(b) and 3(a)

Comparative Example 2 is shown in FIGS. 2(b) and 5(a).

Comparative Example 3 is shown in FIGS. 2(b) and 7(a)

The results are shown in Table 4.

In these multicolor luminescent devices manufactured in the above manner, a fundamental emitting color could be obtained from each color conversion layer. However, the angle of view, to the extent that color alteration (color mixing) did not occur, was ±40 degrees which was an unallowable level in actual use.

Comparative Example 4

A glass plate (Corning 7059) of 100 mm×100 mm×1.1 mm (thickness) used as a support substrate was spin-coated with an acrylate type photocurable resist (viscosity of 250 cps) in which 1% by weight (dry weight) of carbon black was dispersed. After baking at 80° C., the substrate was set on an exposure unit provided with a high pressure mercury-vapor lamp as a power supply. The substrate was exposed to light (wave length of 365 nm) at a dose of 900 mJ/cm² through a mask capable of transferring an image of the pattern of shielding layer as shown in FIG. 11. After developing the substrate in a 1% solution (by weight) of sodium carbonate at room temperature for two minutes, successive exposure was carried out from the entire glass surface of the substrate at a dose of 3,000 mJ/cm², followed by baking at 200° C. to form the pattern of the shielding layer. The thickness of the shielding layer was 20 μm. Also, it was confirmed from SEM that the sectional shape of the pattern was rectangular.

Also, the transmittance of the shielding layer which was measured using a spectrophotometer was more than 10% at wave lengths ranging from 400 nm to 700 nm. Also, the reflectance of the shielding layer was 5%.

Next, a color conversion layer, a transmittable layer, and organic EL elements were formed in the same manner as in Example 1 to manufacture an organic EL multicolor luminescent device.

When a d.c. voltage of 8 V was applied between the anode and the cathode of the multicolor luminescent device, the crossed portions of anodes and cathodes emitted light. The luminance of the organic EL elements viewed from the portion cut off of the shielding layer and the color conversion layer was 100 cd/m². The CIE chromaticity coordinate (JIS Z 8701) was as follows: x=0.16, y=0.24 and light of a blue color was detected.

Also, the luminance of the light viewed from the blue color filter was 45 cd/m² and the CIE chromaticity coordinate was as follows: x=0.20, y=0.21 and light of a blue color was detected.

On the other hand, the luminance of the light viewed from the fluorescent layer A was 130 cd/m² and the CIE chromaticity coordinate was as follows: x=0.30, y=0.50 and light of a yellowish green color was detected.

Further, the luminance of the light viewed from the fluorescent layer B was 36 cd/m² and the CIE chromaticity coordinate was as follows: x=0.50, y=0.32 and light of a pink color was detected.

From the above results, the transmittance of the shielding layer exceeded 10% so that shielding of light for the organic EL elements and the color conversion layer was insufficient. Therefore, light from each color conversion layer was mixed and the chromaticity approached a white color (x=0.32, y=0.31), resulting in deterioration of the color purity.

Comparative Example 5

An organic EL luminescent device was manufactured in the same manner as in Example 5 except that hydrocarbon fluoride was not used as the transmittable medium. Only nitrogen was used. The refractive index of the nitrogen was 1.00 (589 nm).

When a d.c. voltage of 8 V was applied between the anode and the cathode of the multicolor luminescent device, the crossed portions of anodes and cathodes emitted light. The luminance of the organic EL elements viewed from the portion cut off of the shielding layer and the color conversion layer was 100 cd/m². The CIE chromaticity coordinate (JIS Z 8701) was as follows: x=0.16, y=0.24 and light of a blue color was detected.

Also, the luminance of the light viewed from the blue color filter was 34 cd/m² and the CIE chromaticity coordinate was as follows: x=0.14, y=0.12 and light of a blue color was detected.

On the other hand, the luminance of the light viewed from the fluorescent layer A was 100 cd/m² and the CIE chromaticity coordinate was as follows: x=0.28, y=0.62 and light of a yellowish green color was detected.

Further, the luminance of the light viewed from the fluorescent layer B was 24 cd/m² and the CIE chromaticity coordinate was as follows: x=0.60, y=0.31 and light of a red color was detected.

Here the difference between the refractive index $n_1$ of the transmittable layer and the refractive index $n_2$ of the color conversion layer is, specifically, $|n_1-n_2|>0.4$. Therefore, light emitted from the organic EL elements was greatly reflected at the color conversion layer (incidence loss to the color conversion layer) so that the luminance of light from the color conversion layer was decreased.

Table 5 shows the difference between the refractive index $n_1$ of the transmittable layer and the refractive index $n_2$ of the color conversion layer, specifically, $|n_1-n_2|$.

AS the value of $|n_1-n_2|$ becomes large, the luminance tends to decrease. Especially, if the value exceeds 0.4, the luminance is remarkably reduced.

TABLE 5

| | $n_1$ | $n_2$ | $|n_1 - n_2|$ | Blue color filter | Fluorescent layer A | Fluorescent layer B |
|---|---|---|---|---|---|---|
| | | | | Luminance of Color conversion layer (cd/m²) | | |
| Example 1 | 1.50 | 1.50 1.52 | 0–0.02 | 42 | 120 | 30 |
| Example 4 | 1.52 | 1.50 1.52 | 0–0.02 | 42 | 120 | 30 |
| Example 5 | 1.30 | 1.50 1.52 | 0.20–0.22 | 40 | 110 | 28 |
| Comparative Example 5 | 1.00 | 1.50 1.52 | 0.50–0.52 | 34 | 100 | 24 |

What is claimed is:

1. A multicolor luminescent device comprising a color conversion material in which a plurality of shielding layers and a plurality of different color conversion layers are separately and repeatedly assembled on a same support substrate alternating with each other, and an organic EL emitting material including a plurality of organic EL elements separately assembled on the support substrate at each position corresponding to the plurality of color conversion layers, the color conversion material and the organic EL emitting material being disposed so as to sandwich a transmittable medium between them, wherein the distance ($d_1$) between the color conversion material and the organic EL emitting material and the width ($d_2$) of the shielding layer satisfy the equation, $d_2 \geq d_1$.

2. The multicolor luminescent device according to claim 1, wherein the film thickness ($T_1$) of the shielding layer and the film thickness ($T_2$) of the color conversion layer satisfy the equation, $T_1 \geq T_2$.

3. The multicolor luminescent device according to claim 1 wherein an emitting area ($S_1$) of the organic EL element and an area ($S_2$) occupied by the color conversion layer satisfy the equation $S_2 \geq S_1$.

4. The multicolor luminescent device according to claim 1, wherein the color conversion layer includes a fluorescent layer.

5. The multicolor luminescent device according to claim 1, wherein the thickness of the shielding layer is 10 μm or more.

6. The multicolor luminescent device according to claim 1, wherein the refractive index ($n_1$) of the color conversion layer and the refractive index ($n_2$) of the transmittable medium contacting the color conversion layer satisfy the equation, $|n_1-n_2|<0.4$.

7. The multicolor luminescent device according to claim 1, wherein the width ($d_2$) of the shielding layer decreases gradually or stepwise from the transmittable medium side to the opposite side thereof.

8. The multicolor luminescent device according to claim 1, wherein the transmission factor of the shielding layer at a wave length of 400 nm–700 nm is 10% or less.

9. The multicolor luminescent device according to claim 1, wherein the reflection factor of the shielding layer at least in the side contacting the color conversion layer at a wave length of 400 nm–700 nm is 10% or more.

10. The multicolor luminescent device according to claim 1, wherein the transmittable medium comprises at least one insulating materials selected from the group consisting of a transparent resin, an inorganic oxide, an inert gas, an inert liquid, and vacuum.

* * * * *